(12) United States Patent
Rigdon et al.

(10) Patent No.: US 11,936,228 B2
(45) Date of Patent: Mar. 19, 2024

(54) BATTERY CHARGER

(71) Applicant: Black & Decker Inc., New Britain, CT (US)

(72) Inventors: William Rigdon, Baltimore, MD (US); Lisa M. King, Towson, MD (US); Bhanuprasad V. Gorti, Perry Hall, MD (US); Brian K. Wohltmann, Shrewsbury, PA (US); Hussein M. Nosair, Parkville, MD (US); Michael Muilwyk, Felton, PA (US)

(73) Assignee: BLACK & DECKER INC., New Britain, CT (US)

( * ) Notice: Subject to any disclaimer, the term of this patent is extended or adjusted under 35 U.S.C. 154(b) by 57 days.

(21) Appl. No.: 17/348,357

(22) Filed: Jun. 15, 2021

(65) Prior Publication Data

US 2021/0391741 A1    Dec. 16, 2021

Related U.S. Application Data

(60) Provisional application No. 63/039,561, filed on Jun. 16, 2020.

(51) Int. Cl.
*H02J 7/00*    (2006.01)
*H02J 7/02*    (2016.01)

(52) U.S. Cl.
CPC ........ *H02J 7/00712* (2020.01); *H02J 7/0013* (2013.01); *H02J 7/0047* (2013.01); *H02J 7/02* (2013.01)

(58) Field of Classification Search
CPC .................................................. H02J 7/00712
See application file for complete search history.

(56) References Cited

U.S. PATENT DOCUMENTS

| | | | |
|---|---|---|---|
| 2,442,380 A | | 6/1948 | Schrodt et al. |
| 4,697,134 A | * | 9/1987 | Burkum ............... G01R 31/389 |
| | | | 340/636.15 |

(Continued)

FOREIGN PATENT DOCUMENTS

| | | |
|---|---|---|
| WO | 2014029647 A1 | 2/2014 |
| WO | 2018015765 A1 | 1/2018 |

(Continued)

OTHER PUBLICATIONS

Barsukov, "State of charge, State of Power and State of Health", Special Considerations in Battery Management for Industrial Applications, Texas Instruments, Mar. 27, 2019, 19 pages.

(Continued)

*Primary Examiner* — Drew A Dunn
*Assistant Examiner* — Tynese V McDaniel
(74) *Attorney, Agent, or Firm* — Brake Hughes Bellermann LLP

(57) ABSTRACT

The present disclosure is directed to a battery charger for charging a connected battery pack. The battery charger is capable of determining an impedance characteristic value of the battery pack and adjusting a charging scheme, including an initial and/or subsequent charging rates for the battery pack based on the determined impedance characteristic value. The present disclosure is also directed to a method of charging a battery pack. The method includes determining an impedance characteristic value of the battery pack and adjusting a charging scheme, including an initial and/or subsequent charging rates for the battery pack based on the determined impedance characteristic value.

29 Claims, 17 Drawing Sheets

(56) References Cited

U.S. PATENT DOCUMENTS

| | | | |
|---|---|---|---|
| 5,250,904 A | 10/1993 | Salander et al. | |
| 5,572,136 A | 11/1996 | Champlin | |
| 5,583,871 A | 12/1996 | Simmonds et al. | |
| 5,585,728 A | 12/1996 | Champlin | |
| 5,821,756 A | 10/1998 | McShane et al. | |
| 6,008,620 A * | 12/1999 | Nagano | H02J 7/00047 |
| | | | 320/132 |
| 6,072,301 A | 6/2000 | Ashtiani et al. | |
| 6,441,588 B1 | 8/2002 | Yagi et al. | |
| 7,382,102 B2 | 6/2008 | Ashtiani | |
| 8,259,221 B1 * | 9/2012 | Kaplan | H02J 7/00309 |
| | | | 348/207.1 |
| 8,334,675 B2 | 12/2012 | Wang et al. | |
| 9,281,695 B2 * | 3/2016 | Cruise | H01M 10/0525 |
| 9,746,526 B2 | 8/2017 | Fink | |
| 9,874,612 B2 | 1/2018 | Sakai | |
| 10,101,404 B2 | 10/2018 | Suzuki et al. | |
| 10,389,139 B2 * | 8/2019 | Velderman | H02J 3/36 |
| 10,507,734 B2 | 12/2019 | Oguma et al. | |
| 10,534,038 B2 | 1/2020 | Tanaka et al. | |
| 10,684,329 B2 | 6/2020 | Gajewski et al. | |
| 10,705,128 B2 | 7/2020 | Potempa et al. | |
| 10,855,095 B2 | 12/2020 | Marsili et al. | |
| 10,955,484 B2 | 3/2021 | Wu et al. | |
| 11,047,891 B2 | 6/2021 | Potempa et al. | |
| 11,327,119 B2 | 5/2022 | Pressas et al. | |
| 11,460,510 B1 * | 10/2022 | Aoki | G01R 31/392 |
| 11,467,219 B2 | 10/2022 | Matsukawa et al. | |
| 2001/0033169 A1 | 10/2001 | Singh et al. | |
| 2003/0020478 A1 * | 1/2003 | Scott | G01R 31/396 |
| | | | 324/426 |
| 2004/0220752 A1 * | 11/2004 | Gopal | G01R 31/389 |
| | | | 702/31 |
| 2005/0073282 A1 * | 4/2005 | Carrier | H01M 50/204 |
| | | | 320/106 |
| 2006/0017582 A1 | 1/2006 | Lockhart et al. | |
| 2006/0087286 A1 | 4/2006 | Phillips et al. | |
| 2008/0238361 A1 | 10/2008 | Pinnell et al. | |
| 2008/0309289 A1 | 12/2008 | White et al. | |
| 2009/0051364 A1 * | 2/2009 | Ishida | H02J 7/0048 |
| | | | 324/430 |
| 2009/0099802 A1 | 4/2009 | Barsoukov et al. | |
| 2009/0208819 A1 * | 8/2009 | Cruise | H01M 50/20 |
| | | | 429/61 |
| 2010/0007213 A1 * | 1/2010 | Morita | B60L 58/10 |
| | | | 307/103 |
| 2010/0250038 A1 * | 9/2010 | Morita | B60L 58/12 |
| | | | 320/136 |
| 2010/0332165 A1 | 12/2010 | Morrison et al. | |
| 2011/0049977 A1 * | 3/2011 | Onnerud | B60L 3/0046 |
| | | | 307/9.1 |
| 2012/0007556 A1 * | 1/2012 | Matsui | B60L 3/04 |
| | | | 320/112 |
| 2012/0081074 A1 * | 4/2012 | Cunanan | H02P 7/29 |
| | | | 320/112 |
| 2013/0166235 A1 | 6/2013 | Oh et al. | |
| 2014/0111164 A1 * | 4/2014 | Ohkawa | B60L 58/13 |
| | | | 320/134 |
| 2014/0285135 A1 | 9/2014 | Ji et al. | |
| 2014/0285156 A1 * | 9/2014 | Mukaitani | G01R 31/3842 |
| | | | 320/134 |
| 2014/0333267 A1 | 11/2014 | Crawley | |
| 2014/0361740 A1 | 12/2014 | Suzuki et al. | |
| 2015/0198675 A1 * | 7/2015 | Hebiguchi | G01R 31/389 |
| | | | 324/430 |
| 2015/0236536 A1 | 8/2015 | Aradachi et al. | |
| 2015/0241521 A1 * | 8/2015 | Wu | G01R 31/385 |
| | | | 702/63 |
| 2015/0288197 A1 * | 10/2015 | Choi | G01R 31/392 |
| | | | 320/137 |
| 2016/0069963 A1 | 3/2016 | Hebiguchi | |
| 2016/0131719 A1 * | 5/2016 | Takahashi | H01M 10/4285 |
| | | | 324/430 |
| 2016/0204626 A1 * | 7/2016 | Cruz | H02J 7/007192 |
| | | | 320/152 |
| 2016/0344219 A1 * | 11/2016 | Lee | H02J 7/0069 |
| 2017/0077717 A1 * | 3/2017 | Lundgren | H02J 7/00 |
| 2017/0160349 A1 * | 6/2017 | Iida | H02J 7/005 |
| 2017/0170672 A1 | 6/2017 | Yebka et al. | |
| 2017/0299660 A1 | 10/2017 | Saint-Marcoux et al. | |
| 2018/0321326 A1 * | 11/2018 | Tanaka | G01R 31/3842 |
| 2019/0067758 A1 * | 2/2019 | Yamada | G01R 31/392 |
| 2019/0067960 A1 * | 2/2019 | Sun | H02J 7/007 |
| 2019/0101595 A1 * | 4/2019 | Kondo | H01M 10/42 |
| 2019/0341784 A1 * | 11/2019 | Lee | G01R 31/3842 |
| 2019/0379092 A1 | 12/2019 | Schiffer et al. | |
| 2020/0010070 A1 | 1/2020 | Umeda et al. | |
| 2020/0225291 A1 | 7/2020 | Hinterberger et al. | |
| 2020/0313598 A1 | 10/2020 | Katayama et al. | |
| 2020/0321795 A1 * | 10/2020 | Nagano | H01M 10/44 |
| 2020/0326376 A1 * | 10/2020 | Bartels | H02J 7/0063 |
| 2020/0363476 A1 * | 11/2020 | Liu | H02J 7/00 |
| 2020/0408842 A1 * | 12/2020 | Sada | H02J 7/0063 |
| 2021/0311100 A1 * | 10/2021 | Sugisawa | G01R 27/08 |
| 2021/0367442 A1 * | 11/2021 | Konopka | G01R 31/3842 |
| 2021/0376637 A1 * | 12/2021 | Dong | G01R 31/389 |
| 2022/0011373 A1 | 1/2022 | Zappen et al. | |
| 2022/0029443 A1 * | 1/2022 | Konopka | H02J 7/0047 |
| 2022/0043067 A1 * | 2/2022 | Xie | G01R 31/367 |
| 2022/0200311 A1 * | 6/2022 | Oonishi | H02J 9/04 |
| 2022/0404427 A1 | 12/2022 | Munakata et al. | |
| 2023/0198277 A1 | 6/2023 | Rigdon et al. | |

FOREIGN PATENT DOCUMENTS

| | | | |
|---|---|---|---|
| WO | 2020003841 A1 | 1/2020 | |
| WO | 2020064932 A1 | 4/2020 | |

OTHER PUBLICATIONS

Huhman, et al., "A Single-Frequency Impedance Diagnostic for State of Health Determination in Li-ion 4P1S Battery Packs", U.S. Nval Research Laboratory, International Battery Seminar & Exhibit, Mar. 25-28, 2019, Ft. Lauderdale, FL, 36 pages.

PCT International Search Report dated Oct. 1, 2021, issued in connection with PCT Application No. PCT/US2021/037468.

Aglzim, et al., "Impedance Spectrometer Modelling in Matlab/ Simulink for Measureing the Complex Impedance of a Fuel Dell-EIS Method", Journal of Clean Energy Technologies, vol. 1, No. 4, Oct. 2013, pp. 255-259.

Alexander, et al., "Parameterization of a Simplified Physical Battery Model", Proceedings of the 13th International Modelica Conference; DOI 10.3384/ecp19157215;, Mar. 4-6, 2019, pp. 215-220.

Barai, et al., "A Study of the Influence of Measurement Timescale on Internal Resistance Characterisation Methodologies for Lithium-Ion Cells", Scientific Reports; (2018) 8:21; DOI: 10.1038/s41598-017-18424-5, Published online: Jan. 8, 2018, 13 pages.

Barsoukov, et al., "Parametric Analysis Using Impedance Spectroscopy: Relationship Between Material Properties and Battery Performance", Kumho Chemical Laboratories, Korea Kumho Petrochemical Company; 2000, 20 pages.

Bruen, et al., "Modelling and Experimental Evaluation of Parallel Connected Lithium Ion Cells for an Electric Vehicle Battery System", Journal of Power Sources 310 (2016), pp. 91-101.

Carkhuff, et al., "Impedance-Based Battery Management System for Safety Monitoring of Lithium-Ion Batteries", IEEE Transactions on Industrial Electronics, vol. 65, No. 8, Aug. 2018, pp. 6497-6504.

Carullo, et al., "Low-Cost Electrochemical Impedance Spectroscopy System for Corrosion Monitoring of Metallic Antiquities and Works of Art", IEEE Transactions on Instrumentation and Measurement, vol. 49, No. 2, Apr. 2000, pp. 371-375.

Dai, et al., "Impedance Characterization and Modeling of Lithium-Ion Batteries Considering the Internal Temperature Gradient", Energies 2018, 11, 220; doi:10.3390/en11010220; www.mdpi.com/journal/energies, Published: Jan. 17, 2018, 18 pages.

Dubarry, et al., "Origins and Accommodation of Cell Variations in Li-Ion Battery Pack Modeling", International Journal of Energy Research; Int. J. Energy Res. 2010; 34:216-231; Published online: Dec. 17, 2009, pp. 216-231.

(56) References Cited

OTHER PUBLICATIONS

Juarez-Robles, et al., "Impedance Evolution Characteristics in Lithium-Ion Batteries", Journal of The Electrochemical Society, 164 (4) A837-A847 (2017) pp. A837-A847.

Kurzweil, et al., "State-Of-Charge Monitoring by Impedance Spectroscopy During Long-Term Self-Discharge of Supercapacitors and Lithium-Ion Batteries", Batteries 2018, 4, 35; doi:10/3390/batteries4030035; Published Aug. 1, 2018, 13 pages.

Landinger, et al., "High Frequency Impedance Characteristics of Cylindrical Lithium-Ion Cells: Physical-Based Modeling of Cell State and Cell Design Dependencies", Journal of Power Sources 488 (2021) 229463; 2021, 14 pages.

Meddings, et al., "Application of Electrochemical Impedance Spectroscopy to Commercial Li-Ion Cells: A Review", Journal of Power Sources 480 (2020) 228742; 2020, 27 pages.

Park, et al., "Online Embedded Impedance Measurement Using High-Power Battery Charger", IEEE Transactions on Industry Applications, vol. 51, No. 1; Jan./Feb. 2015, pp. 498-508.

Rangarajan, et al., "In Operando Impedance Based Diagnostics of Electrode Kinetics in Li-Ion Pouch Cells", Journal of The Electrochemical Society, 166 (10) A2131-A2141, Published Jun. 19, 2019, Pates A2131-A2141.

Richardson, "Impedance-Based Battery Temperature Monitoring", Department of Engineering Science University of Oxford; Balliol College, Dec. 2016, 174 pages.

Saidani, et al., "Lithium-Ion Battery Models: a Comparative Study and a Model-Based Powerline Communication", Adv. Radio Sci., 15, 83-91, 2017; Published Sep. 21, 2017, pp. 83-91.

Spielbauer, et al., "Experimental Study of the Impedance Behavior of 18650 Lithium-Ion Battery Cells Under Deforming Mechanical Abuse", Journal of Energy Storage 26 (2019) 101039; 13 pages.

Troltzsch, et al., "Characterizing Aging Effects of Lithium Ion Batteries by Impedance Spectroscopy", Electrochimica Acta 51 (2006); pp. 1664-1672.

Westerhoff, et al., "Analysis of Lithium-Ion Battery Models Based on Electrochemical Impedance Spectroscopy", Energy Technology; 2016, pp. 1620-1630.

Yang, et al., "A Simplified Fractional Order Impedance Model and Parameter Identification Method for Lithium-Ion Batteries", PLoS ONE doi:10.1371/journal.pone.0172424, Feb. 17, 2017, 13 pages.

* cited by examiner

BATTERY CHARGER

RELATED APPLICATIONS

This application claims priority under 35 U.S.C. § 119(e) to U.S. Provisional Patent Application No. 63/039,561, filed Jun. 16, 2020, titled "Battery Charger."

TECHNICAL FIELD

This application relates to a battery pack charger system and a method for charging a battery pack. In one implementation, the system is configured to determine impedance properties of a battery pack and provide a charging scheme based on the determined impedance properties.

BACKGROUND

Electric tools include an electric motor and require a source of electricity to power the motor. Cordless electric tools source electricity from a battery. Battery may be provided integrally housed within the power tool or provided as a battery pack attachable to the power tool via a battery interface.

With reference to FIG. 1, a cordless device, such as a power tool, is illustrated and designated with reference numeral 1. The power tool 1 ordinarily includes a clam shell type housing 2. The housing 2 includes a mechanism 3 to couple the housing 2 with a battery pack 4. The cordless device 1 includes electrical elements 5, typically included in a terminal block (not shown in FIG. 1), which couple with corresponding electrical elements 6 of the battery pack 4, also typically included in a terminal block (not shown in FIG. 1). The power tool 1 includes a trigger 7, such as a trigger switch and which may be referred to herein as trigger 7, which is activated for energizing a motor 8 provided within the housing 2, as is well known in the art. The motor 8 may illustratively be a permanent magnet DC motor of the type conventionally used in cordless power tools. Normally, a plurality of battery cells 9 are disposed within the battery pack 4. A tool controller 10 may be provided in housing 2 for controlling the motor 8. The controller may alternatively (or additionally) be disposed in the battery pack 4, identified with reference number 206 (FIG. 2A) and may also be used for controlling the charge of the battery pack 4, as well as its discharge.

FIG. 2A shows a battery pack 4 coupled to a charger 200. The plurality of battery cells 9 are interconnected to provide the desired voltage and current. The power connections for charging and discharging the battery pack 4 are through the terminals A and B. Inside the battery pack 4 there is a pack ID component 202 connected to the charger 200 or the power tool 1 (FIG. 2B) through the terminal G which, when used with the charger 200 or the power tool 1, can define the chemistry of battery cells 9, capacity of the battery pack 4, and/or other characteristics to either the charger controller 204 or the power tool controller 10 (FIG. 2B). The charger controller 204 may include functions to limit the voltage and current during charge. The battery pack 4 may also have one or more temperature sensors (such as a thermistor) 209 connected to both the charger unit via the terminal F and the battery pack controller 206 inside the battery pack 4. The battery pack controller 206 may illustratively be responsible for the protection of the cells 9 for any condition exposed on the terminals A, B by the user (the charger, tool, and/or user tampering). The discharge or charge current can be clamped or discontinued by the semi-conductor devices Q1 and Q2, which may be MOSFETs, broadly referred to as switches. The battery pack controller 206 may be powered by a separate power supply, such as internal power supply 208. A driver circuit 210 may be disposed between battery pack controller 206 and control inputs of the switches Q1, Q2.

When connected to a charger 200, the charger controller 204 can be powered from the battery pack power supply 208 through the terminals A and C. This is only an example as other means for powering the charger controller 204 can be employed. Battery and charger information can be exchanged via the data terminals D and E. The charger controller 204 then will drive power controller 212 of the charger 200 to deliver the desired voltage and current to the battery pack 4 based on information received through the terminals and/or stored in the charger.

With reference to FIG. 2B, the battery pack 4 is shown connected to the power tool 1. The tool controller 10 may be powered from the battery pack power supply 208 through the terminals A and C. The power tool 1 may contain a tool ID component 214 connected to the battery pack controller 206 through the terminal H. The power tool 1 may contain a switch S1 that pulls the terminal B high when the switch Q1 is off. If the switch Q1 is left off while the battery pack 4 is dormant, and suddenly the switch S1 is pulled, the terminal B could be used to wake the battery pack 4 from a dormant mode of operation. The power tool controller 10 could be configured to read the trigger 7 position and report that data back to the battery pack controller 206 through data the terminals D and E. The battery pack controller 206 will vary the PWM duty cycle of the power supplied to the motor 8 of the power tool 1 through the switch Q1 to power the motor 8 at a desired motor speed. While the switch Q1 is off, the diode D1 in the power tool 1 will re-circulate any inductive motor current to prevent voltage spikes. It should be understood that the switch Q1 could alternatively be included in the power tool 1 and controlled by the power tool controller 10 to vary the PWM duty cycle.

The power tool 1, the battery pack 4 and the charger 200 may illustratively have a separate ground path, indicated by the terminal C in FIGS. 2A and 2B, for the data lines, which are connected via the terminals D and E in FIGS. 2A and 2B. Providing a separate ground path for the data signal connections, be they analog or digital, from the power connections on the terminals A and B isolates the ground path for the data signals from the power connections. This reduces the possibility of charge or discharge currents traveling through the control circuits for the cordless system components. As used herein, a "system component" is a component that can be connected to another component of the cordless system and include, but are not limited to, battery packs, the chargers, and cordless devices such as cordless power tools. The ground path isolation will also provide a reduction in electrical noise in analog and digital communication systems. The ground terminals C may illustratively be staggered in the terminal blocks used in the cordless system components so that the ground terminals of the cordless system components are the first terminals to make contact when the battery pack 4 is mated to the power tool 1 or to the charger 200. This allows the power tool controller 10 or the charger controller 204 to be on before the power tool 1 or the charger 200 is activated.

The battery pack ID component 202 and tool ID component 214 may be one or more analog components, such as resistors, capacitors, or combinations thereof, or digital components. FIG. 3 shows a simplified schematic of an "analog only" identification system in which the resistors in the battery pack 4 identify characteristics of the battery pack 4, such as temperature, charging voltage, charging current, to the charger 200 or to the power tool 1, which then charge or discharge the battery pack 4 accordingly. Pack ID component 202 is a resistor and the value of the resistance is used to identify the characteristics of the battery pack 4 to the charger 200 or the power tool 1, depending on whether the battery pack 4 is connected to the charger 200 or the power tool 1. With reference to FIG. 2B, tool ID component 214 is a resistor and the value of the resistance is used to identify the characteristics of the power tool 1 to the battery pack controller 206. Other components, such as mechanical keys, lockout protrusions, magnetic sensing and the like can be used as ID components 202, 214.

The battery pack 4, the charger 200 and the power tool 1 include ID and communication functions that provide a way for these various system components to identify and communicate data. The ID and communication functions can be implemented in various ways, as described in more detail below, that allow varying levels of information to be passed between the system components. The way in which the ID and communication functions are implemented in any particular component or cordless system would depend on the needs of the component or system, which would determine the type and amount of information needed to be communicated between two or more of the components in the system.

As described above with reference to FIGS. 2A and 2B, the battery pack 4 includes a pack ID component 202 and a temperature sensor 209, which may be a thermistor. In addition to the battery pack ID component 202 and temperature sensor 209, analog identification and communication system 300 (FIG. 3) includes the resistor 302 that identifies a voltage parameter of the battery pack 4 and the resistor 304 that identifies a current parameter of the battery pack 4. The battery pack ID component 202 may be a resistor. It should be understood, however, that other analog components could be used, such as capacitors, as well as combinations of different types of analog components, such as combinations of the resistors and capacitors.

The battery pack ID component 202, temperature sensor 209, and the resistors 302, 304 identify parameters of the battery pack 4 to the system component to which the battery pack 4 is connected, such as the charger 200 in the case of the example embodiment shown in FIG. 3. The charger 200 then may use this information to control the charging of the battery pack 4. For example, the battery pack ID component 202 may identify the chemistry of the battery pack 4, that is, the type of battery cells used in it, to the charger 200. Illustrative types of battery cells are Nickel Cadmium cells, Nickel Metal Hydride cells, and Lithium Ion cells. The charger 200 would then charge the pack using the appropriate charge algorithms for the particular chemistry. Temperature sensor 209 would provide a signal to the charger 200 indicative of the temperature of the battery pack 4. Controller 204 of the charger 200 then illustratively uses that the battery pack 4 temperature information to control the charging of the battery pack 4 so that charging does not occur when the temperature of the battery pack 4 is outside of an acceptable temperature range for charging the battery pack 4. The resistor 302 may provide information about a voltage parameter of the battery pack 4. For example, the value of the resistor 302 may be used to indicate the voltage at which the battery pack 4 is to be charged. The charger controller 204 then sets the voltage at which the charger 200 charges the battery pack 4 based on this value. Similarly, the resistor 304 may illustratively provide information about a current parameter of the battery pack 4. For example, the value of the resistor 304 may be used to indicate the maximum current at which the battery pack 4 is to be charged. Controller 204 of the charger 200 then limits the current at which it charges the battery pack 4 to be below this maximum current parameter.

SUMMARY

An aspect of the present invention may include a battery charger for determining impedance properties or characteristics of an attached battery pack and charging the battery pack with a charging scheme based on the determined impedance properties.

A example embodiment of the aforementioned battery charger may include an AC impedance circuit including circuitry to apply a sinusoidal AC excitation signal to a connected battery pack and to measure a battery pack response to the applied sinusoidal AC excitation signal; a charger controller including circuitry to (1) calculate impedance value of the battery pack based on the applied sinusoidal AC excitation signal and the measured battery pack response and (2) select a charging scheme based on the calculated impedance value of the battery pack; and a power supply including circuitry to provide the selected charging scheme.

The aforementioned example embodiment may further include a battery charger, wherein the applied AC excitation signal is a voltage excitation signal and the battery pack response is a current waveform.

The aforementioned example embodiment may further include a battery charger, wherein the applied AC excitation signal is a current signal and the battery pack response is a voltage waveform.

The aforementioned example embodiment may further include a battery charger, wherein the charger controller includes a first reference impedance value, a second reference impedance value and a third reference impedance value and wherein if the calculated impedance value is greater than or equal to the first reference impedance value and less than the second reference impedance value the charger controller selects a maximum charging rate charging scheme to charge the battery pack and if the calculated impedance value is greater than or equal to the second reference impedance value and less than the third reference impedance value the charger controller selects a charging rate charging scheme that is less than the maximum charging rate to charge the battery pack and if the calculated impedance value is greater than or equal to the third reference impedance value the charger controller selects a do not charge charging scheme to charge the battery pack.

The aforementioned example embodiment may further include a battery charger, wherein the maximum charging rate is based on a battery identification signal received by the charger controller from the battery pack.

The aforementioned example embodiment may further include a battery charger, wherein the sinusoidal AC excitation signal is at approximately 1 kHz.

The aforementioned example embodiment may further include a battery charger, wherein a lower calculated impedance value indicates a higher charging rate charging scheme.

The aforementioned example embodiment may further include a battery charger, wherein the calculated impedance value of the battery pack is measured using the equation $R=V/I$, wherein V is the peak amplitude of the voltage excitation signal and I is the peak amplitude of the current waveform and accounts for purely resistive contributions to the calculated impedance at a chosen frequency.

The aforementioned example embodiment may further include a battery charger, wherein the sinusoidal AC excitation signal is applied to a positive terminal and a negative terminal of the connected battery pack.

The aforementioned example embodiment may further include a battery charger, wherein the first reference value is 0.025 Ohms, the second reference value is 0.040 Ohms and the third reference value is 0.055 Ohms.

Another aspect of the present invention may include a method for charging a battery pack including determining impedance properties or characteristics of the battery pack and selecting a charging scheme based on the determined impedance properties.

A example embodiment of the aforementioned method for charging a battery pack may include providing an AC impedance circuit, the AC impedance circuit applying a sinusoidal AC excitation signal to a connected battery pack and measuring a battery pack response to the applied sinusoidal AC excitation signal; providing a charger controller, the charger controller (1) calculating an impedance value of the battery pack based on the applied sinusoidal AC excitation signal and the measured battery pack response and (2) selecting a charging scheme based on the calculated impedance value of the battery pack; and providing a power supply, the power supply providing the selected charging scheme.

The aforementioned example embodiment may further include a method for charging a battery pack, wherein the applied AC excitation signal is a voltage excitation signal and the battery pack response is a current waveform.

The aforementioned example embodiment may further include a method for charging a battery pack, wherein the applied AC excitation signal is a current signal and the battery pack response is a voltage waveform.

The aforementioned example embodiment may further include a method for charging a battery pack, wherein the charger controller includes a first reference impedance value, a second reference impedance value and a third reference impedance value and wherein if the calculated impedance value is greater than or equal to the first reference impedance value and less than the second reference impedance value the charger controller selects a maximum charging rate charging scheme to charge the battery pack and if the calculated impedance value is greater than or equal to the second reference impedance value and less than the third reference impedance value the charger controller selects a charging rate charging scheme that is less than the maximum charging rate to charge the battery pack and if the calculated impedance value is greater than or equal to the third reference impedance value the charger controller selects a do not charge charging scheme to charge the battery pack.

The aforementioned example embodiment may further include a method for charging a battery pack, wherein the maximum charging rate is based on a battery identification signal received by the charger controller from the battery pack.

The aforementioned example embodiment may further include a method for charging a battery pack, wherein the sinusoidal AC excitation signal is at approximately 1 kHz.

The aforementioned example embodiment may further include a method for charging a battery pack, wherein a lower calculated impedance value indicates a higher charging rate charging scheme.

The aforementioned example embodiment may further include a method for charging a battery pack, wherein the calculated impedance value of the battery pack is measured using the equation R=V/I, wherein V is the peak amplitude of the voltage excitation signal and I is the peak amplitude of the current waveform and accounts for purely resistive contributions to the calculated impedance at a chosen frequency.

The aforementioned example embodiment may further include a method for charging a battery pack, wherein the sinusoidal AC excitation signal is applied to a positive terminal and a negative terminal of the connected battery pack.

The aforementioned example embodiment may further include a method for charging a battery pack, wherein the first reference value is 0.025 Ohms, the second reference value is 0.040 Ohms and the third reference value is 0.055 Ohms.

These and other advantages and features will be apparent from the description and the drawings.

DETAILED DESCRIPTION

Figure 1:
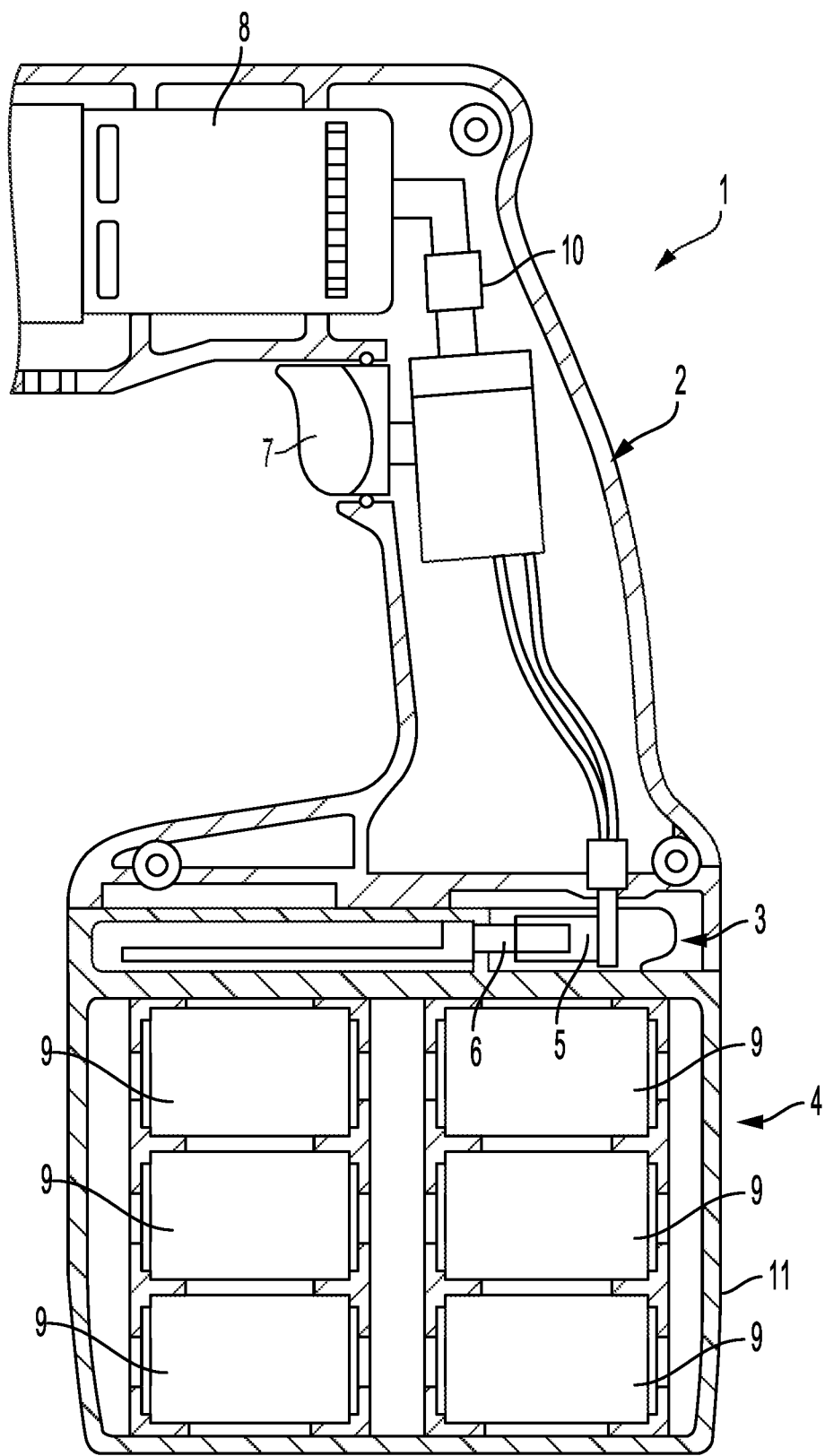
FIG. 1 illustrates an example cordless power tool coupled to an example battery pack.
Figure 2A:
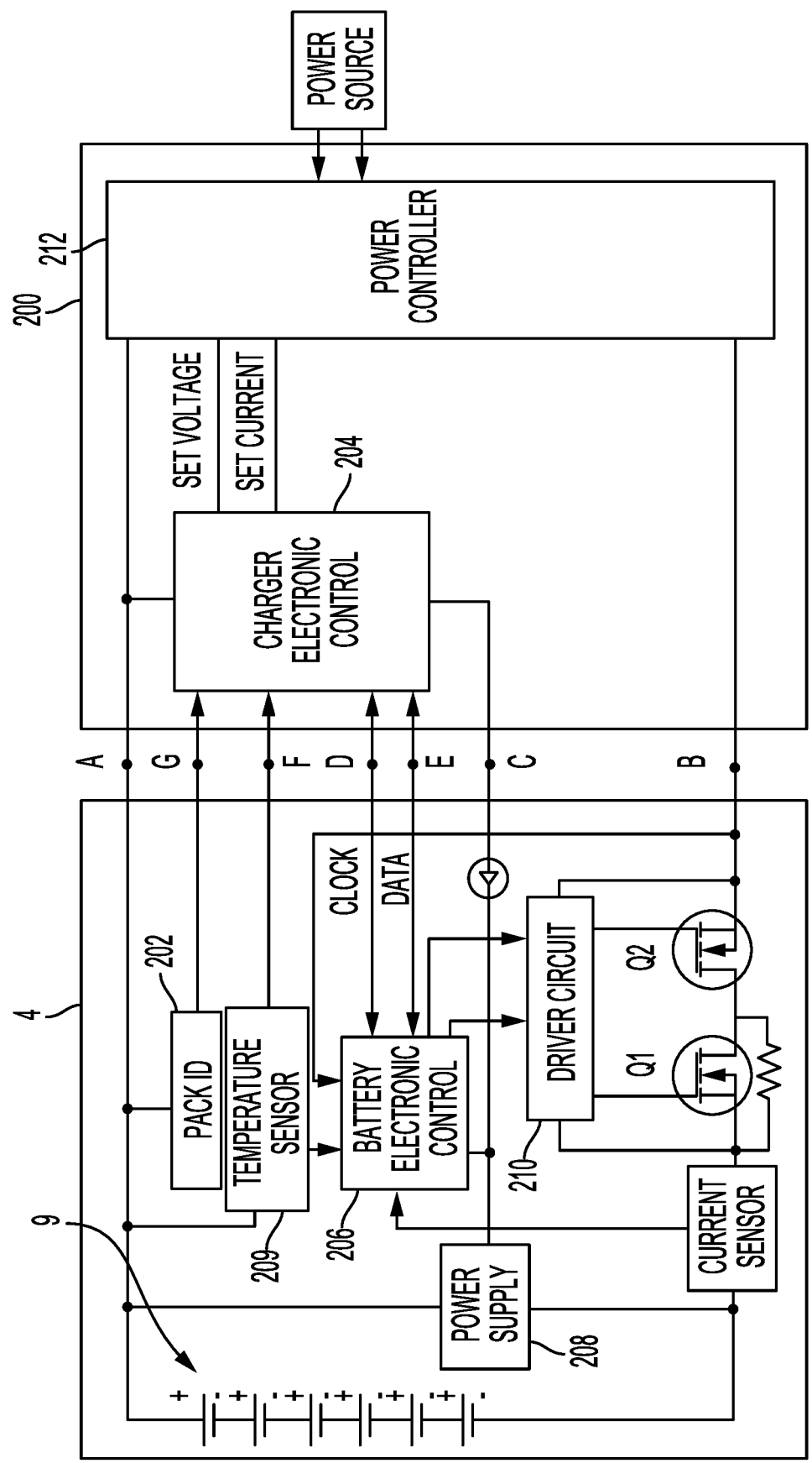
FIG. 2A illustrates a simplified schematic diagram of an example battery pack coupled to an example battery charger and FIG. 2B illustrates a simplified schematic diagram of the example battery pack of FIG. 2A coupled to an example cordless power tool.
Figure 2B:
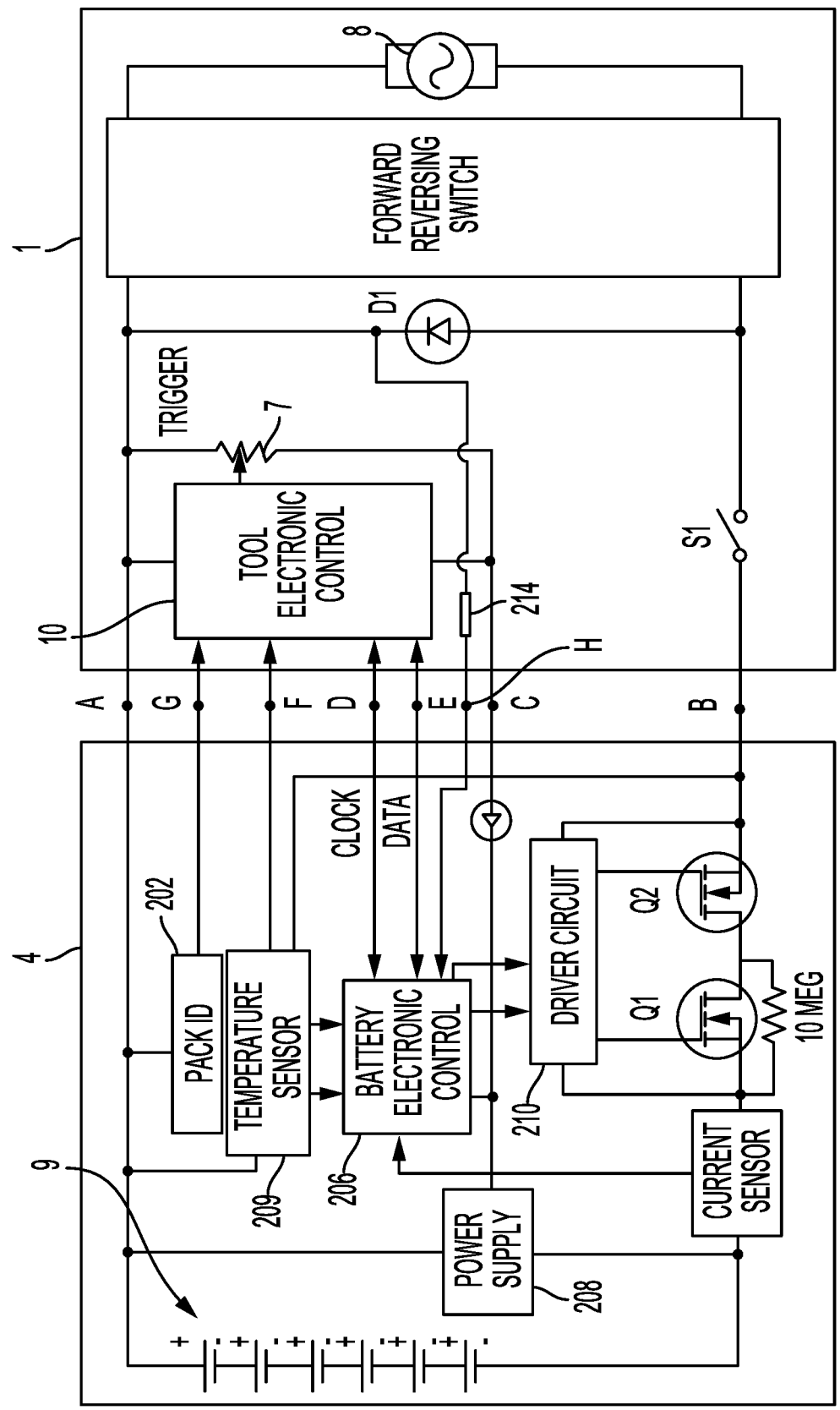
Figure 3:
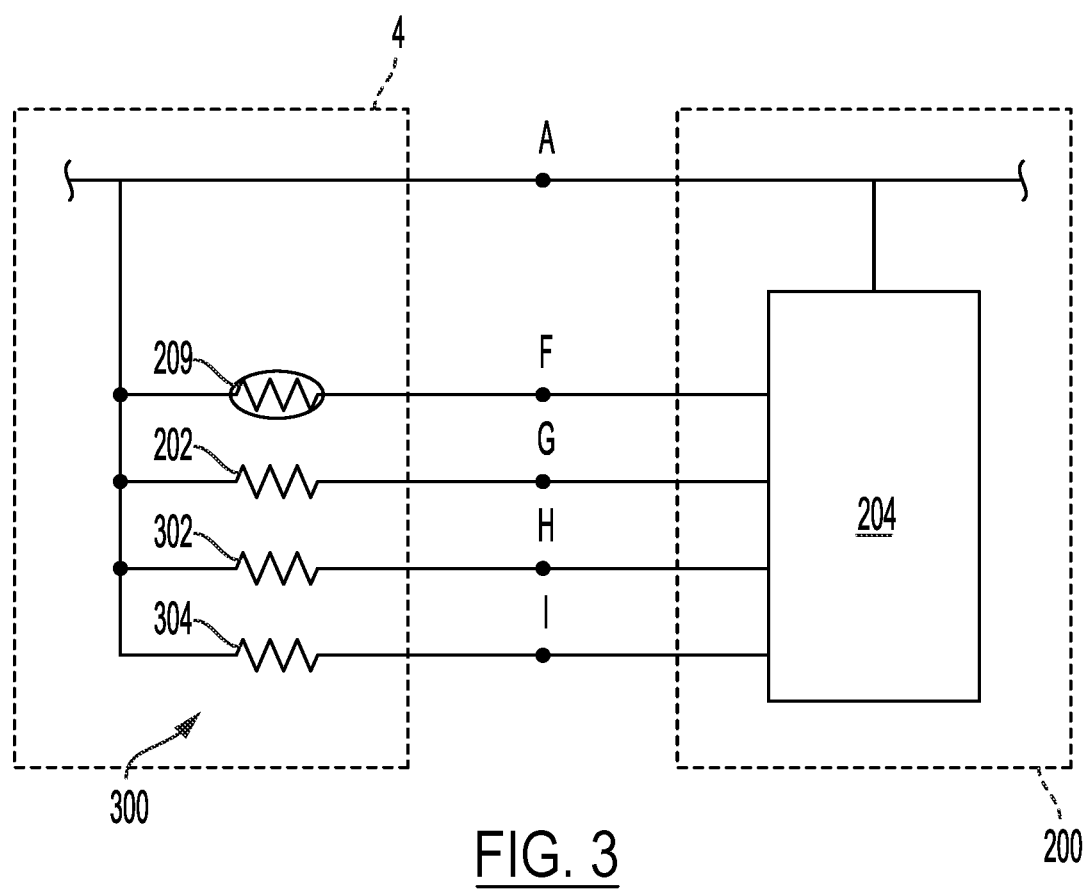
FIG. 3 illustrates a simplified schematic diagram of an example battery pack coupled to an example battery charger.

Referring to FIG. 1 through FIG. 3, in an example embodiment, a

Figure 4A:
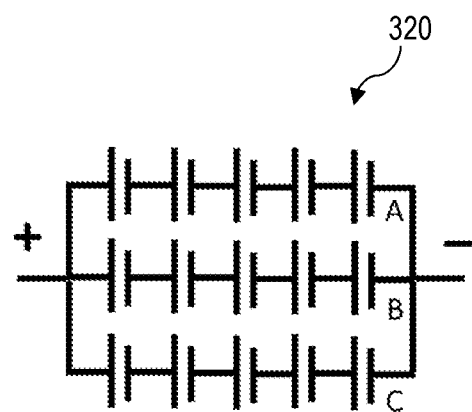
FIG. 4A illustrates an example set of battery cells in a first state.

FIG. 4A depicts an example circuit diagram of a battery pack 320 having three parallel strings of five cells (5S3P), in an example embodiment. As discussed above, battery packs include multiple cells that include, for example, lithium or lithium-ion chemistry. The battery cells may be electrically connected in series to increase the voltage rating of the battery pack, in parallel to increase the current and/or charge capacity of the battery pack, or a combination of series and parallel configuration. For example, a battery pack marketed as a 20V Max battery pack in the power tool industry with a nominal voltage of approximately 18V may include a single string of five battery cells (5S1P), or multiple such strings of five battery cells connected in parallel (5S×P, where x>1) and represents the number of strings connected in parallel. The battery pack current capacity, and consequently its runtime, may be increased by increasing the number of strings of battery cells connected in parallel. In this example, the parallel connections are made at the ends of the strings, through it should be understood that parallel connections may be made at any point within the strings or even between each cell. In an example embodiment, the battery pack may be a convertible battery pack where the strings of cells may be switchably configured in series or parallel depending on the voltage requirement of the connected power tool. U.S. Pat. No. 9,406,915, which is incorporated herein by reference in its entirety, describes examples of such a convertible battery pack.

As described above, battery chargers typically include the terminals that make electrical contact with the terminals of the battery pack to supply electric power for charging the battery cells. In some implementations, the battery pack includes a pack identification (ID) feature, such as an internal resistor, that is detectable by the charger. Battery packs having different voltage or current ratings have different pack ID resistor values. The charger detects the value of the resistor by, for example, measuring the voltage drop across the resistor at a given current. The charger may then tailor its charging scheme in accordance with the pack ID. For example, in a battery pack made up of cells having a maximum charge current rating of 4A, the charger may apply a charging current of 12 A to a battery pack having three strings of parallel cells, a charging current of 8 A to a battery pack having two strings of parallel cells, and a charging current of 4 A to a battery pack having a single string of cells. This scheme enables charging higher capacity battery packs at higher currents while ensuring that each battery cell is charged at a current below its maximum charge current rating.

A problem arises is if a battery cell terminal is disconnected from its string of cells. This may occur if, for example, an electrical connection of a cell is broken due to wear, vibration, fall, or other damage. Manufacturing defects and other related phenomena are known to result in weakened or broken welds that join cells together. It is also not uncommon for this disconnection to happen over the normal aging of a battery over its life. Often, this break in the electrical path comes from a pressure activated device used in batteries known as the Current Interrupt Device (CID). However, battery cells rely upon multiple mechanisms to break the circuit in abusive conditions that include not only the CID, but also a cell vent at high temperature and/or pressure. Some cells may include a Positive Temperature Coefficient (PTC) switch, which is designed to reversibly open the circuit at high temperatures. Furthermore, a fuse of an internal tab connected to the terminal may trip in exceedingly high current situations. In case of these other mechanisms not activating prior to the cell reaching a dangerously high internal temperature or due to other various reasons such as localized heating event(s) in the cell, a porous plastic separator between electrodes may melt, which also leads to increased electrical impedance. Externally, a battery pack 322 may include multiple fuse elements that are often designed as primary safeguards and typically included on each string of cells in the battery pack. In case of short circuits or high currents, one or more of these fuses may be activated, which may not always render the battery pack 322 unusable or prevent further charging which could lead to undesired secondary consequences. As battery packs include increasing numbers of cells joined together, it becomes more critical to detect if a cell and/or electrical pathway has become fully disconnected, partially disconnected, or even just degraded somehow.

Figure 4B:
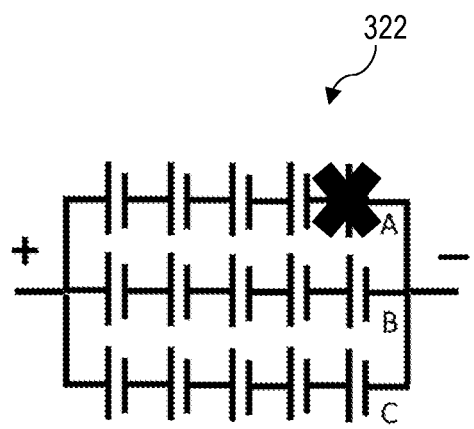
FIG. 4B illustrates the example set of battery cells of FIG. 4A in a second state and FIG. 4C illustrates the example set of battery cells of FIG. 4A in a third state.
Figure 4C:
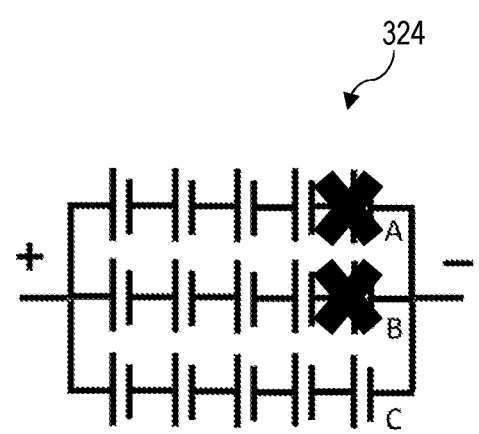

FIG. 4B depicts a battery pack 322 that is similar to the 5S3P battery pack 320 of FIG. 4A, but in which breakage of a single cell cuts off the current path through a string of cells due to one of the many aforementioned scenarios. This causes a charging current of 6 A to be applied to each of the remaining, intact strings of cells. The charging current applied to each cell is therefore greater than the cell maximum charge of 4 A current limit rating and has the potential of causing damage to the cells and risks the possibility of a safety event.

FIG. 4B depicts a battery pack 324 that is similar to the 5S3P battery pack 320 of FIG. 4A, but in which breakage of two cells may cut off current paths through two strings of cells. This causes a charging current of 12 A to be applied to each cell of the remaining strings of cells. This charging current significantly exceeds the maximum charge current rating (e.g. 4A) of the cells and can cause catastrophic damage to the battery pack and even the user or other valuable property.

In an example embodiment, to overcome this problem, the charger is configured to measure an impedance of the battery pack and modify the charging scheme and/or charge current rate accordingly, as described herein in detail.

Figure 5:
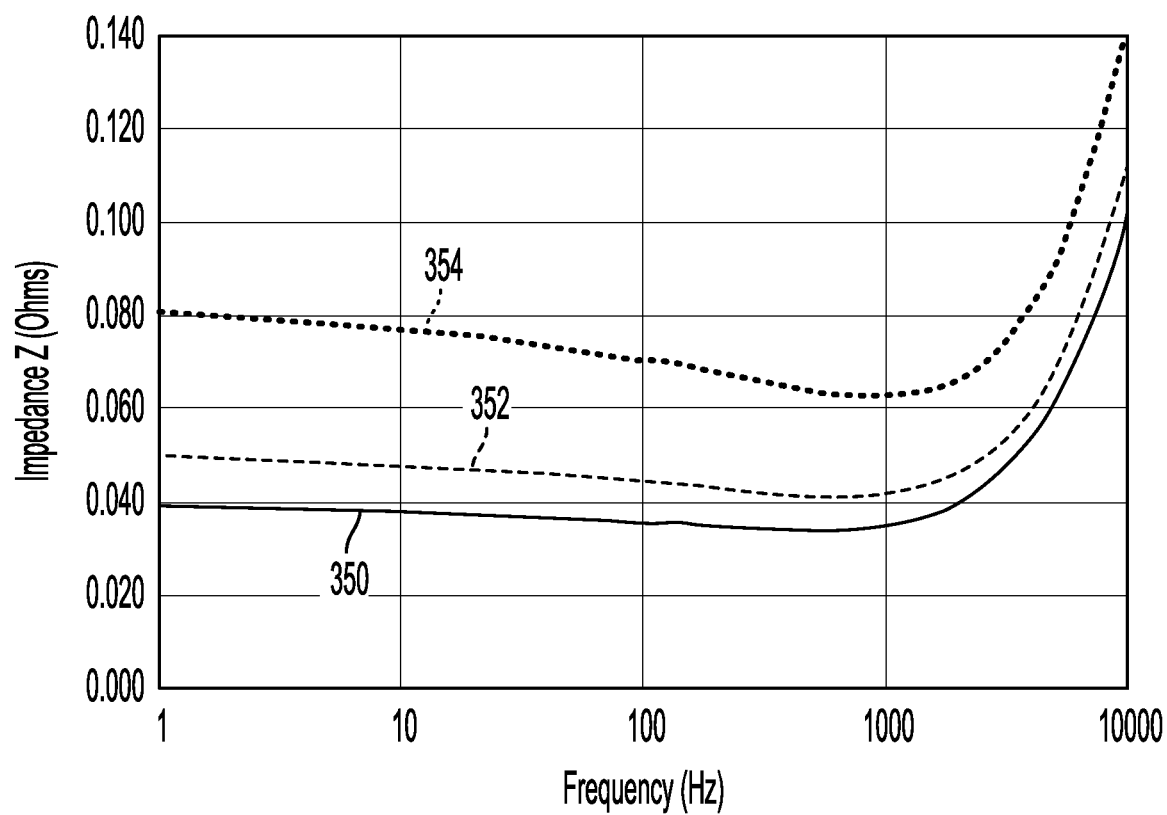
FIG. 5 illustrates a Bode plot of the set of battery cells of FIGS. 4A, 4B, 4C.

FIG. 5 depicts a waveform diagram including Bode plots 350-354 of impedance Z/Frequency (Hz) for the battery packs 320-324 respectively. Specifically waveform 350 is the Bode plot of the battery pack 320, which is healthy with no breakages or disconnections of battery cells in 5S3P configuration; waveform 352 is the Bode plot of the battery pack 322, which includes breakage of a single string of cells (i.e., two healthy strings of cells—5S2P); and waveform 354 is the Bode plot of the battery pack 324, which includes breakage of two strings of cells (i.e., only one healthy string of cells—5S1P).

The frequency component of this plot for measurement of battery impedance using an AC frequency-injection technique will be explained in detail later in this disclosure, but what is important to understand from this diagram is that at a given AC frequency (e.g., at 1 kHz) or narrow range of frequency, the measured impedance 350 from the healthy battery pack 320 is lower than the measured impedance 352 from the battery pack 322 with a single string breakage, which in turn is lower than the measured impedance 354 of the battery pack 324 with two line breakages. In other words, in an example embodiment, existence of faults or disconnections in one or more strings of battery cells results in increased impedance of the battery pack.

Table 1 below shows the expected impedance associated with different numbers of parallel connections within an example battery pack. It should be noted that these values are provided by way of example, and different battery packs may exhibit different impedance characteristics.

TABLE 1

| Parallel Connections of 5S | 1 kHz Impedance Range (Ohms) |
| --- | --- |
| 1 | 0.055-0.070 |
| 2 | 0.040-0.055 |
| 3 | 0.025-0.040 |

In an example embodiment, the charger 200 is configured to measure the impedance of the battery pack and reduce the charging current applied to the battery pack if it detects a higher impedance from the battery pack than expected. For instance, if the battery pack ID is associated with a battery pack impedance range of 0.025-0.040 Ohms, and the charger 200 measures a battery pack impedance of approximately 0.03 Ohms, it proceeds to apply a normal (default) current charge rate for that battery pack to charge the battery pack. However, if the charger 200 measures a battery pack impedance in the range of 0.040-0.055 Ohms, it charges the battery pack at a slower rate to avoid applying overcurrent to the battery cells. If the charger 200 measures a battery pack impedance of above a higher threshold (e.g., above 0.055 Ohms), it stops charging the battery pack altogether. This condition likely occurs if too many strings of cells within the battery pack have breakages or have otherwise been degraded unacceptably.

Figure 6:
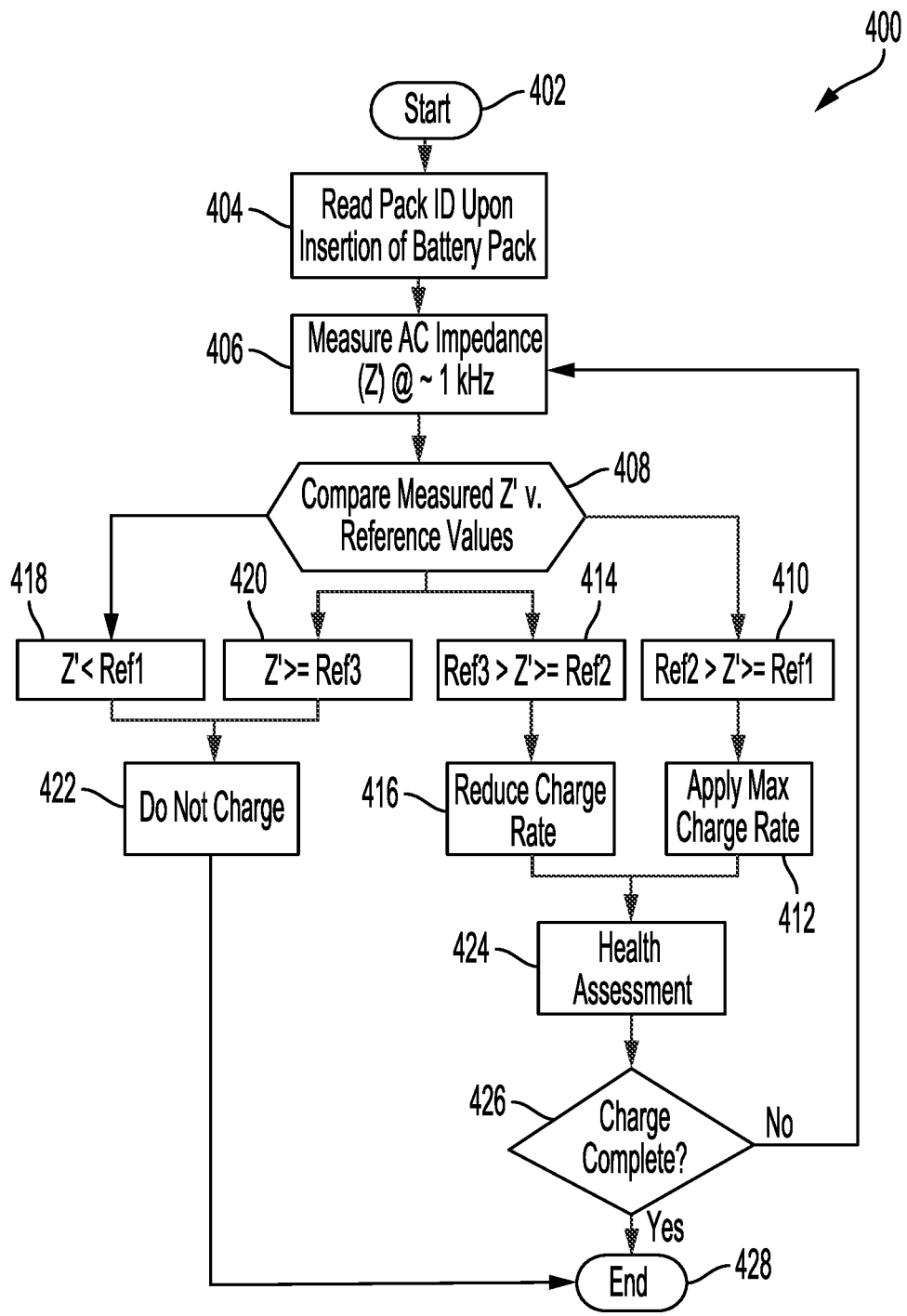
FIG. 6 illustrates a flow chart of an example process for setting a charging scheme of an example battery charger.

FIG. 6 depicts a flow diagram of a process 400 executed by the charger controller 204 to control the charge rate of the battery pack based on the battery pack impedance. In an example embodiment, beginning in step 402, the charger controller 204 reads the battery pack ID from the battery pack resistor upon the battery pack being inserted into the charger in step 404. In this step, the controller 204 sets first, second, and third reference impedance values Ref1, Ref2, and Ref3 based on the battery pack ID. As such, in an example embodiment, a measured impedance Z in the range of Ref1-Ref2 indicates a healthy battery pack suitable for charging at a fast rate. In an example embodiment, the measured impedance being in the range of Ref2-Ref3 indicates a battery pack that includes a breakage in one of its strings but is still capable of being operated safely and capable of being charged at a lower charge rate. In an example embodiment, the measured impedance being greater than Ref3 indicates that the battery pack has too many defects to be charged. In the example of Table 1 above, Ref1, Ref2 and Ref3 may be respectively set to 0.025, 0.04 and 0.055 Ohms.

In step 406, the controller 204 measures the real impedance (Z') of the battery pack. As will be described later in detail, controller 204 makes this measurement using an AC frequency-injection technique, whereby an AC (Alternating Current) excitation signal is applied at a selected frequency and the resultant response is measured. As also described later in detail, the AC frequency is designed to minimize the contribution of inductive and chemical impedances to the measured impedance Z, whereby the measured impedance Z is substantially equivalent to the battery pack's real impedance Z' which is primarily constituted of resistive contributions and wherein capacitive and inductive contributions have been minimized. This frequency is often associated with a minimum total impedance Z in the pack and/or where the phase shift between excitation and response waveforms is near 0 degrees. In this example, the excitation frequency is 1,000 Hz, but may vary from this and can be found by adjusting to identify the ideal frequency based on the aforementioned description. In an example embodiment, the applied AC excitation signal is a voltage waveform and the resultant response is a current waveform. Alternatively, the applied AC excitation signal is a current waveform and the resultant response is a voltage waveform. The real impedance Z' at this frequency is calculated by dividing the voltage amplitude by the current amplitude and is sometimes referred to simply as the electrical impedance of the battery. This term is used interchangeably in this application to differentiate the electrical impedance of the battery from its chemical reaction dominated impedance.

In another example embodiment, the battery pack impedance may be measured using a DC (Direct Current) technique, as will be described later in the disclosure. In yet another example embodiment, a combination of the AC frequency-injection technique and the DC technique, or a combination of AC frequencies, may be utilized. These techniques are described later in further detail. The process for optimizing the charging of the battery pack based on the measured impedance is executed in substantially the same way irrespective of the technique used for measuring the battery pack impedance.

In step 408, the measured electrical impedance Z' is compared to the threshold references Ref1, Ref2 and Ref3. If Z' is approximately within the range of Ref1 and Ref2, as indicated in step 410, controller 204 determines that the measured battery pack impedance value corresponds to its expected value for an undamaged battery pack and applies a maximum charge rate to the battery pack in step 412 which can be completed in a safe and reliable method.

If, however, Z' is in the range of Ref2 and Ref3, as indicated in step 414, controller 204 determines that an electric fault such as a breakage of a string of battery cells exists within the battery pack or other possible degradation effects has occurred. In this case, in step 416, controller 204 applies a reduced charge rate to the battery pack. The reduced charge rate may be a set value (e.g., 50% of maximum charge), or may be calculated as a function of the measured impedance Z'.

If Z' is less than Ref1, as indicated in step 418, the controller 204 refrains from charging the battery pack altogether in step 422. This condition indicates a different form of abnormality in the battery pack caused by, for example, over-discharge of the battery cells or a shortage between the cell electrodes. For example, in some unusual cases, an external electrical short may have occurred outside the cells. Similarly, if Z' is greater than Ref3, as indicated in step 420, controller 204 refrains from charging the battery pack in step 422. This condition indicates that there are too many broken or degraded electrical connections within the battery pack such that charging the remaining battery cells at even a slow rate can cause damage to the battery pack or result in safety concerns.

In an example embodiment, following steps 412 or 416, controller 204 may assess the health and/or age of the battery pack to make further adjustments to the charging rate of the battery pack in step 424. This step is described in detail later in this disclosure.

In step 426, controller 204 determines whether the state of charge of the battery pack has reached its limit. If not, controller 204 repeats steps 406-424 again or a sub-combination of these steps. Otherwise, process 400 ends in step 428.

The AC frequency injection technique is described herein with reference to FIGS. 7-11, according to an example embodiment.

Figure 7:
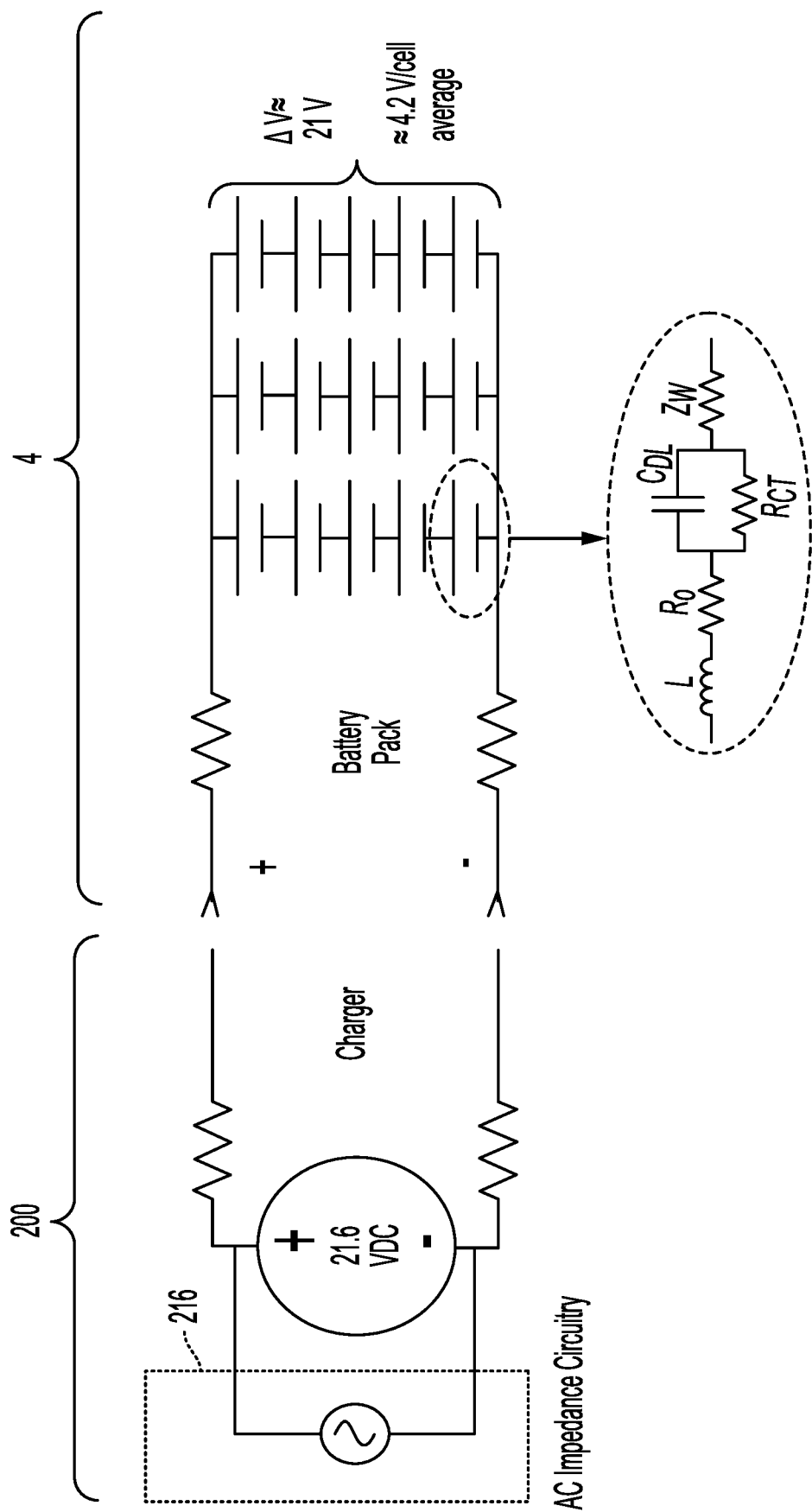
FIG. 7 illustrates a simplified circuit diagram of a battery charger.

FIG. 7 depicts a simplified circuit diagram of the charger 200 provided with an AC impedance circuitry 216 for applying an AC excitation signal to the battery pack 4 for implementation of the AC frequency injection technique, according to an example embodiment. In an example embodiment, AC impedance circuit 216 is configured to apply a sinusoidal AC excitation signal to the battery pack 4 and measures the battery pack response to calculate the impedance properties of the battery pack 4 using fundamental aspects of electrochemical impedance spectroscopy (EIS). This may include, but is not limited to, excitation and response in accordance with principles of linearity, causality, stability, and finity. As stated above, in an example embodiment, the AC impedance circuit 216 may apply a voltage excitation signal and measure the resultant current waveform, or alternatively apply a current excitation signal and measure the resultant voltage waveform. In either case, the real battery impedance may be measured by Ohms law, R=V/I, where the V and I are the peak amplitude of the voltage and current waveforms and accounts for purely resistive contributions to the impedance at the chosen frequency.

In an example embodiment, the AC excitation signal is applied to the B+/B− terminals of the battery pack 4. The resultant response is also measured through the B+/B− terminals of the battery pack 4. In other example embodiments, the AC excitation and response may be measured through other terminals the charger has direct access to for individual cells or cell sub-units.

FIG. 7 further depicts resistive and capacitive properties of a battery cell modeled using a known impedance-based universal equivalent circuit model. In this model, L and $R_0$ together denote the electrical impedance of the battery pack, and the $R_{CT}/C_{DL}$ circuit in combination with $Z_W$ denote the chemical impedance of the battery pack. Specifically, the electrical impedance of the battery pack is made up of inductive impedance (L) associated with various electrical conductors including wound foils within the cells, and predominantly resistive impedance ($R_0$) associated with all the electronic pathways (wires, terminals, electrodes, welds, etc.) in addition to dissolved ions which are mobile within the battery cell electrolyte. The chemical impedance of the battery pack is made up of a capacitive/resistive component (the $R_{CT}/C_{DL}$ circuit). This may also refer to the Faradaic impedance, which results from capacitive and resistive characteristics acting jointly at the reactive interface of electrolytes and electrodes by surface adsorption of ions and electrochemical reactions within the battery cell. In the simplified universal equivalent circuit model provided, the $R_{CT}$ is intended to describe all chemical polarization resistance (i.e., $R_{Chemical}$), although in some instances additional descriptions may be included for equivalent circuits that fit better with added combinations of resistive and capacitive elements. The chemical impedance of the battery pack also includes $Z_W$ which is the diffusion-based ion resistance of the battery cell which becomes relevant at high currents and/or long timescales associated with very low frequencies.

Accordingly, electrical impedances of the battery pack are associated with electrical connections that carry current to and from the battery cells and are independent of charge/discharge reactions. Chemical impedances are associated with material chemistry and electrode construction of the battery cells. Different battery packs may have slightly different cell chemistries and therefore different chemical impedances. Chemical impedances also vary by the age of the battery pack, temperature, state of charge, and other factors. By contrast, absent damage to electrical connections of the battery packs, battery packs of the same construction tend to have similar electrical impedance regardless of age, temperature, and state of charge. Since the electrical impedance is closely associated with interconnections between battery cells and the terminals, accurate measurement of the electrical impedance Z' where excitation and response are nearly in phase is an effective way to determine electrical fault, breakage, or abnormal degradation within the battery pack.

In an example embodiment, the battery impedance as measured by the charger is a combination of these impedances. Due to the material interactions within the battery cells, the contribution of the chemical impedance may vary with the applied excitation frequency. According to an example embodiment, at certain optimal excitation frequencies, the capacitive impedance $C_{DL}$ becomes very small or close to zero, which effectively substantially removes the chemical impedance component from the measured impedance. Accordingly, applying excitation frequency within an optimal range allows for substantially isolating the chemical impedance from the electrical impedance such that the measured impedance is most closely correlated to the electrical impedance only. Furthermore, according to an example embodiment, the range of the excitation frequency may be further optimized to limit the impact of inductive impedance on the measured impedance value, resulting in the measured impedance that is most closely correlated to the electrical resistance only. This frequency associated with measurement of Z' in 400 may be found for instance by locating a minimum in total impedance Z and/or where the phase shift is equal or nearly equal to 0° between excitation and response waveforms ideally applied in nearly sinusoidal manner.

Figure 8:
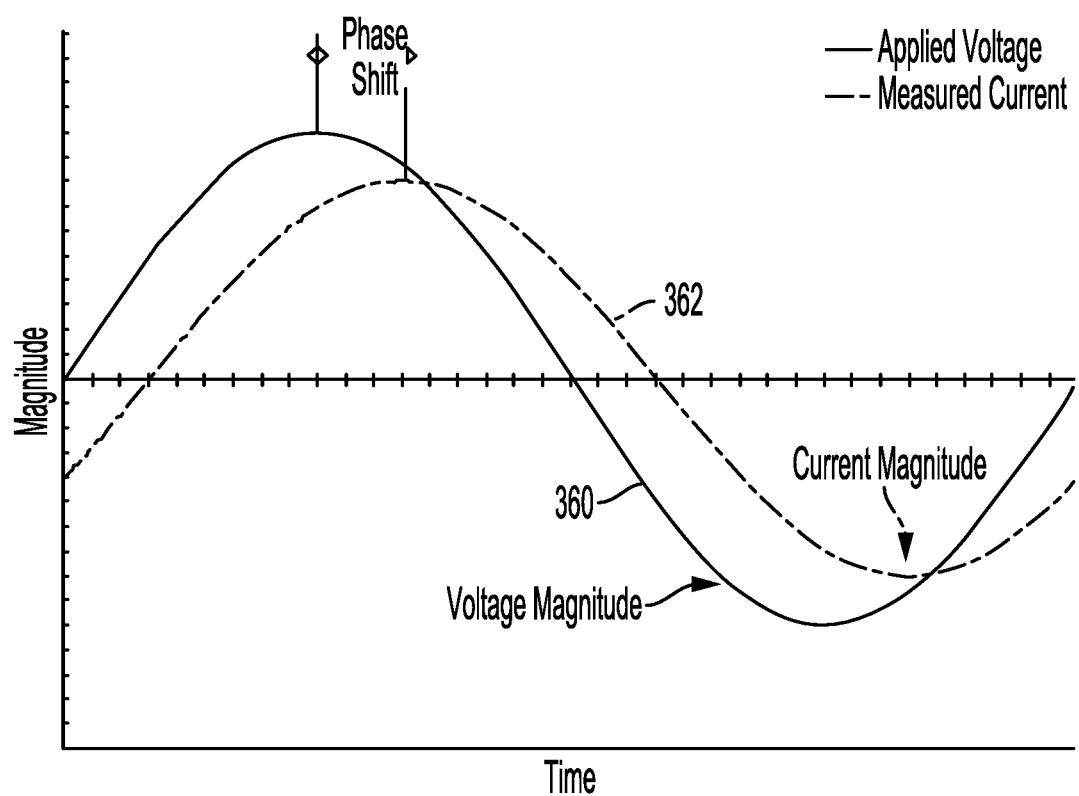
FIG. 8 illustrates a waveform diagram of an excitation signal and a resultant current waveform.

FIG. 8 depicts a waveform diagram of an excitation voltage signal 360 and the resultant current waveform 362, according to an example embodiment. A phase shift between waveforms 360 and 362, as defined by the degree by which the zero-crossings of the two waveforms 360 and 362 are out of sync, or the degree by which the peaks of the two waveforms 360 and 32 are out of sync, can be seen in this figure. In an example embodiment, the phase shift varies based on the excitation frequency applied by the AC impedance circuit 216. A negative phase shift is associated with capacitive properties of the battery pack cells, and a positive phase shift is associated with inductive properties of the battery pack cells. Thus, in an example embodiment, in order to reduce or eliminate the effect of capacitive impedances of the battery cells on the measured impedance, i.e., to reduce the value of $C_{DL}$ to close to zero, the excitation frequency is set to a value that produces a slight positive phase shift or a phase shift substantially close to zero in the negative direction. Further, in an example embodiment, in order to minimize the adverse effect of inductive impedances on the battery cells on the measured impedance, it is desirable to ensure that phase shift value is limited in the positive direction.

Accordingly, in an example embodiment, to optimize the excitation frequency applied by the AC impedance circuitry, a first factor that is considered is that the excitation frequency does not result in phase shift too far in the negative range in order to minimize or significantly eliminate the battery contribution to the chemical impedance. Additionally, a second factor that is considered is that the excitation frequency does not result in significant contribution from the inductive impedance.

Figure 9:
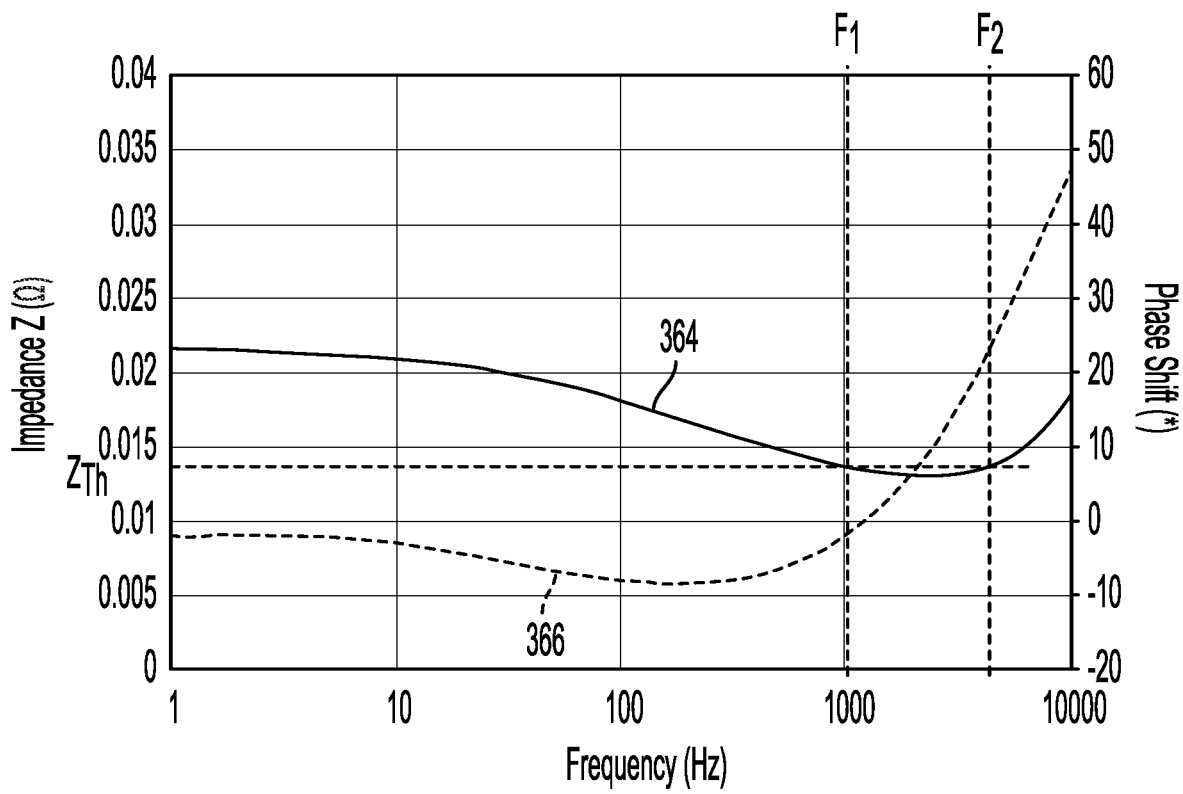
FIG. 9 illustrates a Bode plot of a measured impedance and a phase shift as a function of the applied excitation frequency of FIG. 8.

FIG. 9 depicts a Bode plot of the measured impedance 364 and phase shift 366 as a function of the applied excitation frequency. In an example embodiment, as shown in this figure, the measured impedance plot 364 is at its lowest (i.e., below a threshold level of $Z_{Th}$) when the applied frequency is within the range of F1 and F2. This indicates that the adverse impact of chemical and inductive impedances is at a negligible level if the frequency is within the range of F1 and F2. In the example of FIG. 9, threshold impedance $Z_{Th}$ is 0.013 Ohms, corresponding to the F1-F2 range of approximately 1,000 to 6,000 Hz. In an example embodiment, an excitation frequency within this range results in most efficient and most accurate measurement of the electrical resistance, while significantly isolating the inductive and chemical impedances of the battery pack from the measured impedance. It should be understood, however, that the frequency range of 1,000 to 6,000 Hz is an example only and the frequency range can vary based on a variety of characteristics including, for example, the material construction of the battery cells, the cell chemistry, the shape and construction of electrical connections, and the number of cells.

Specifically, in an example embodiment, at frequency levels of less than approximately 1,000 Hz, the phase shift is negative, which indicates presence of high chemical impedance in the measured impedance. While in this figure the phase shift is slightly below zero at 1,000 Hz, the contribution of the chemical impedances is negligible, as this figure is the result of testing on high power cells that are designed to have low chemical impedances. Further, while the phase shift 366 increases from zero to approximately 50 degrees as an excitation frequency is increased between 1,000 to 10,000 Hz, the impact of inductive impedance is negligible until the excitation frequency surpasses F2, in this example around 6,000 Hz.

Accordingly, in an example embodiment, in order to further optimize the excitation frequency applied by the AC impedance circuitry, a third factor that is considered is the excitation frequency is limited within a range F1-F2 within which the measured frequency is maintained below a threshold $Z_{Th}$. This frequency range could be pre-programmed and is expected to have minimal variation as result of extraneous factors including but not limited to temperature, age, and abuse.

Figure 10:
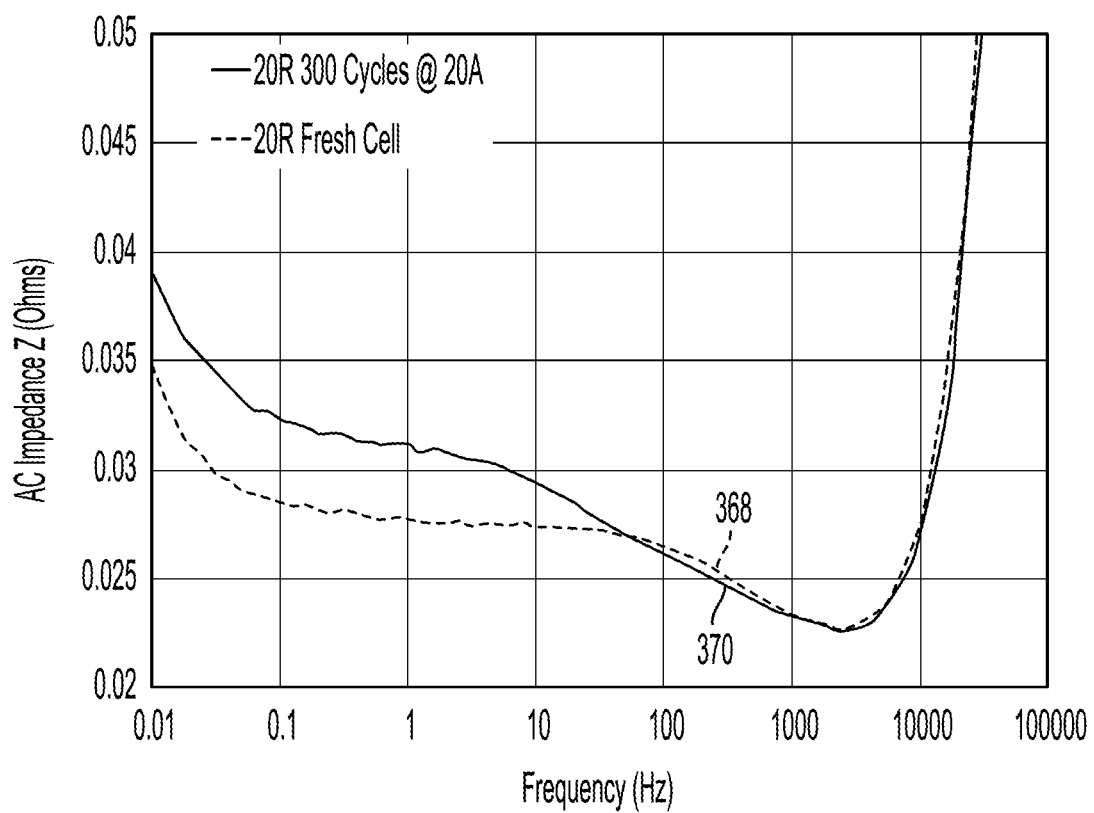
FIG. 10 illustrates a Bode plot of measured AC impedances of a healthy battery pack and of an aged battery pack.

FIG. 10 depicts a Bode plot of measured AC impedances for a healthy new battery pack 368 and an aged battery pack 370. As battery packs age, the chemical impedance of the battery pack (i.e., low frequency impedance <1 kHz) is adversely affected. This adverse effect can be seen at lower excitation frequencies (e.g., below 100 Hz), where the impedance of a new battery pack is markedly less than the impedance of an aged battery pack. By contrast, at high frequency levels, particularly at 1,000 Hz and above, the measured impedances of new and old battery packs substantially match in non-abusive aging conditions. Since the age and the chemical resistance of the battery pack has little to no bearing on the state of the electrical connections inside the pack, it is advantageous to apply the excitation frequency at a level that minimizes any such age-dependent chemical resistance. Thus, in an example embodiment, as a fourth factor in selecting an optimal excitation frequency more measuring the electrical impedance applied by the AC circuitry, the excitation frequency is selected within a range that minimizes the difference in measured impedance of a new battery pack and an aged battery pack.

Figure 11:
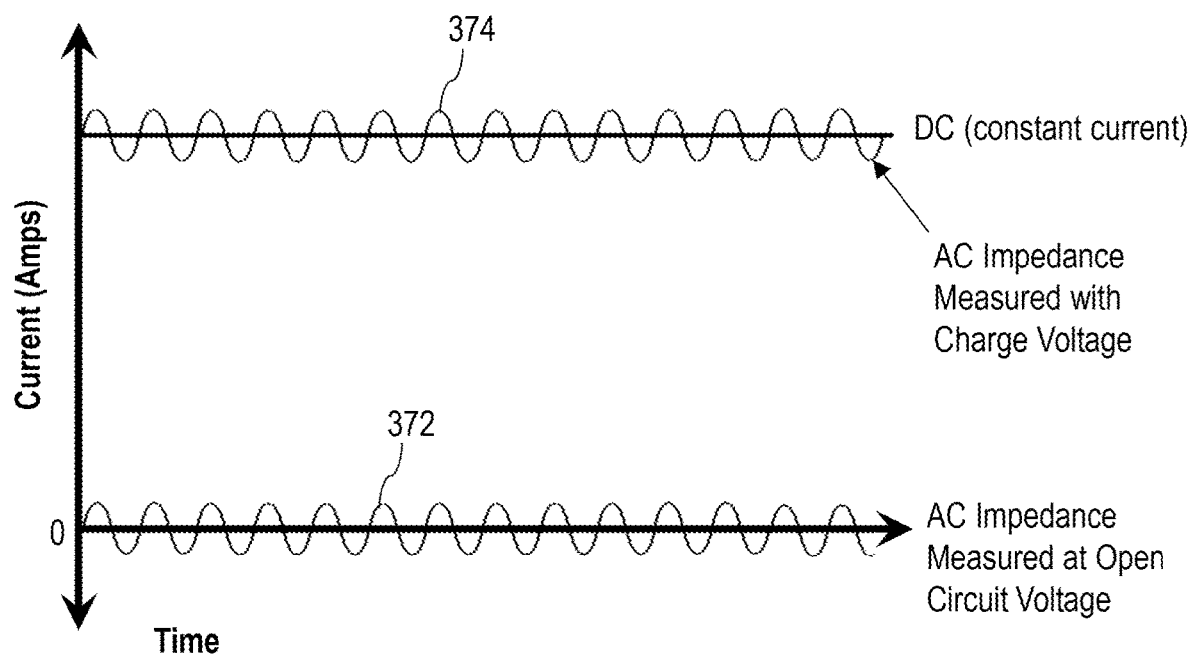
FIG. 11 illustrates an example waveform diagram of an AC excitation waveform.

FIG. 11 depicts a waveform diagram showing an AC excitation waveform 372 being applied while substantially zero net charge or discharge current is being applied to the battery pack 4. In this case, the net charge flow into or out of the battery pack is approximately 0 Amp·Hours. Alternatively, an AC excitation waveform 374 may be injected under discharge or charge, e.g., while a constant DC current is being applied to the B+/B− terminals of the battery pack 4 to charge the battery cells. In this case, the AC frequencies are combined with the constant current DC waveform. In an example embodiment, this allows the charger 200 to inject the AC excitation waveform 374 and detect the resultant response waveform without interference with the DC charge or discharge signal.

The AC frequency-injection technique described above offers several advantages over the DC technique. Namely, the AC frequency-injection technique allows measurement of impedance near or at its open circuit potential or open circuit voltage (i.e., in steady state or resting state) or under charge (i.e., without interrupting the charge current to the battery pack). AC currents can be applied to the battery pack at very low amplitude which have negligible effects on the state of the battery. Using small current excitation and signal processing also may allow for reduction in circuit cost and complexity. By contrast, the DC technique requires application of a DC current to or from the battery cells which effectively changes its state. Further, since resistance, capacitance, and inductance are frequency-dependent, the AC frequency-injection technique allows for application of an optimized excitation frequency that more easily isolates the impact of chemical and/or inductive impedances and most closely correlates the measured impedance with the real resistive impedance. This combination of factors allows for accurate detection of impedance with lowest susceptibility to error from extraneous variables such as state of charge (SOC), age, and temperature of the battery pack, and convolution from ancillary measurement faults associated with the battery pack thermistor or alike. By contrast, the DC technique has greater susceptibility to temperature and is SOC-dependent and requires analysis of hysteresis and non-linearities to ascertain the resistive impedance of the battery pack. This requires a controller capable of fast sampling and processing of the DC pulse measurements. Furthermore, analysis of DC pulse requires very fast signal processing to measure responses from the battery at timescales of approximately 1 millisecond (equivalent to 1 kHz), for instance. In processing AC signals, there have been sampling techniques such as synchronous demodulation which allow for simplification of signal processing by using slower sampling speeds (e.g. A to D) and reconstructing a waveform across multiple periods that reduce processing power and resolution requirements of electronic hardware which make it more practical. It is also difficult to apply and stabilize a constant current in 1 millisecond or less due to slew rate limitations and times required for reaching stable current. For all of the reasons, and likely others, AC impedance measurements have advantage at the higher frequencies targeted in aforementioned example embodiments of the application.

Nonetheless, the DC impedance measurement may be utilized as an alternative or in addition to the AC frequency-injection technique described above. DC impedance measurement is particularly useful for measuring the combined electrical and chemical impedance of the battery pack. As will be described later in this disclosure, in an example embodiment, accurate measurement of the chemical impedance may be useful in determining the age and chemical health of a battery pack. Using the AC frequency-injection technique, chemical impedance can be theoretically measured in lower frequency ranges (e.g. 0.1 to 1 Hz as shown FIG. 10). In practice, however, applying a low excitation frequency below 1 Hz encounters high levels of noise and other limitations that make it practically difficult to make accurate impedance measurements using the AC frequency-injection technique. However, for sake of measuring combined electrical and chemical impedance, it is an effective technique and can be used alternatively to DC. Although, the charger already applies a DC charge current and it is convenient to take advantage of this for assessing total impedance at longer timescales (e.g., 1 second).

Figure 12:
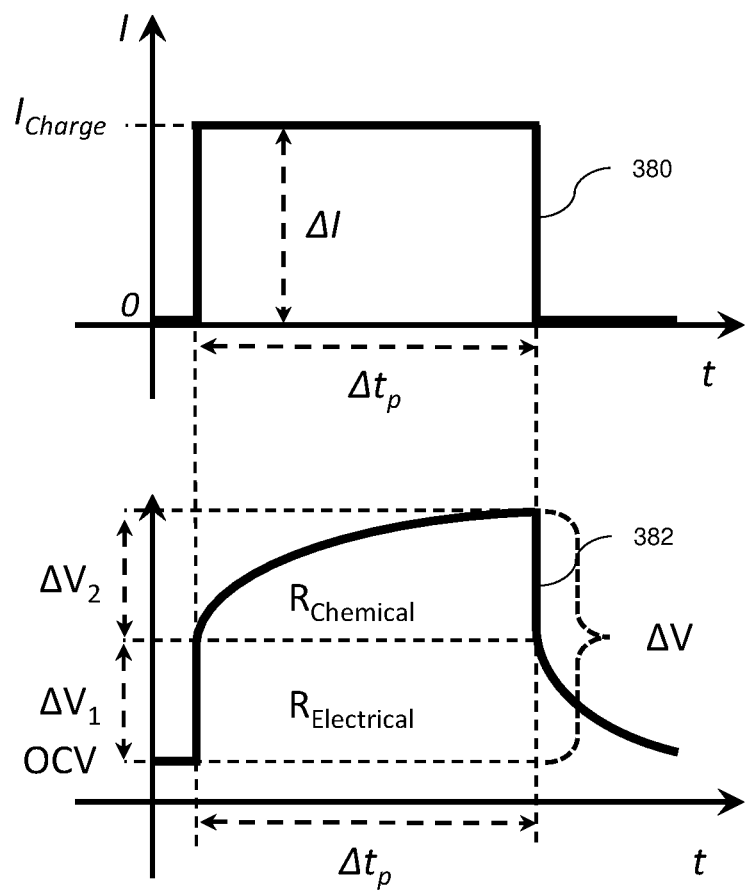
FIG. 12 illustrates a simplified current and voltage waveform diagram for impedance measurement using a DC technique.
Figure 13:
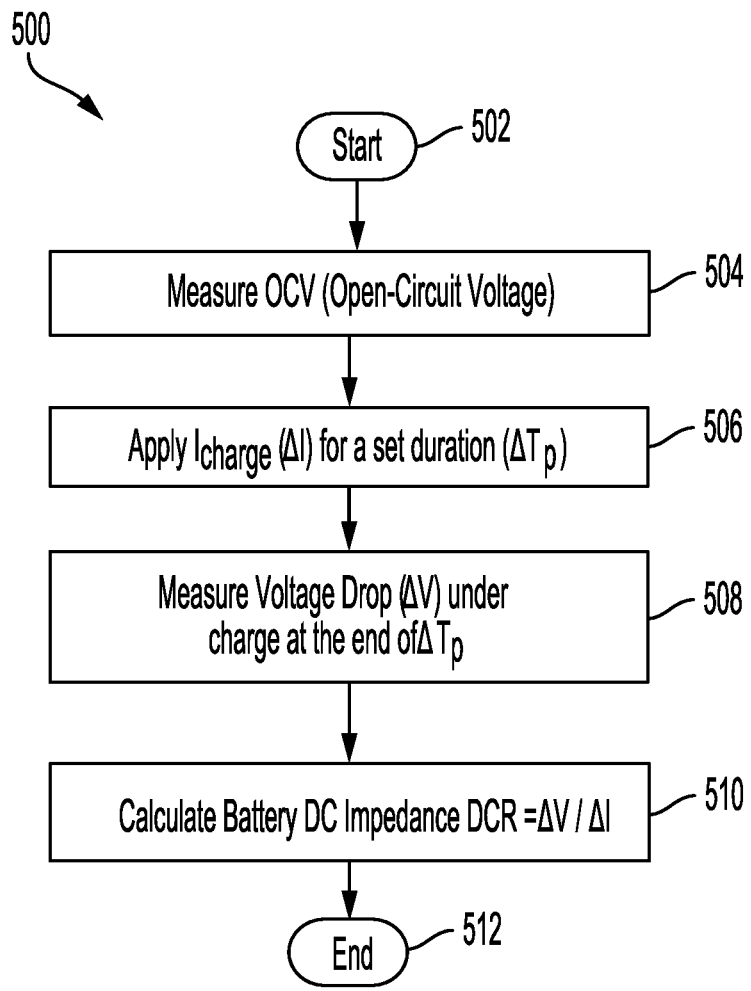
FIG. 13 illustrates an example flow chart for implementing the DC technique.

FIG. 12 depicts a simplified current and voltage waveform diagram for impedance measurement using a DC technique, according to an example embodiment. FIG. 13 depicts an example process 500 executed by the charger controller 204 to calculate battery pack impedance using the DC technique, according to an example embodiment. Referring to these two figures, in an example embodiment, beginning in step 502, the charger 200 initially measures an OCV (Open-Circuit Voltage) of the battery pack in step 504. The OCV may correspond to at least the state of charge of the battery pack or greater. The charger 200 then applies a constant current pulse 380 ($\Delta I$) to the battery pack for a set duration $\Delta t_p$ in step 506, and then measures the resultant voltage waveform 382 ($\Delta V$) from the battery pack in step 508. The battery pack total impedance is measured as a function of $\Delta V/\Delta I$ in step 510. Process 500 ends in step 512. In an alternative example embodiment, the information for $\Delta V/\Delta I$ can be obtained after any change in current applied results in change in voltage measured at specified intervals of time that are associated with different contributions to the DC resistance or DCR.

In an example embodiment, the voltage waveform 382 includes a fast response $\Delta V_1$ associated with electrical impedance described previously and approximately equivalent to the 1 kHz real impedance if measured at 1 millisecond after application of current pulse of the battery pack (i.e., $R_0$ in FIG. 7 or $R_{Electrical}$ in FIG. 12), followed by a relatively slow response $\Delta V_2$ associated with chemical impedance of the battery pack (i.e., $R_{CT}$ in FIG. 7 or $R_{Chemical}$ in FIG. 12). The electrical portion of the impedance may be derived from $\Delta V_1$ by sampling the voltage at various points in step 508 described above response to the applied current, provided that the charger controller 204 has sufficient processing power for fast sampling of $\Delta V_1$ during the fast response time. In an example embodiment, the sampling may be made at approximately 1 millisecond or less for accurate determination of $\Delta V_1$. This would necessitate measuring the resultant voltage during the current pulse at multiple points (e.g., 1 millisecond and 1 second).

It is noted that the DC technique described here may be performed by a charge pulse or a discharge pulse. The waveform diagram of FIG. 12 represents a charge pulse. However, the DC resistance or DCR technique is not limited to a pulse and the same information may be obtained by measuring battery voltage information at specified interval of time after current is either applied in charge or discharge. Furthermore, the same information or substantially equivalent information can be obtained by measuring battery voltage differences while the current is being applied and after it is turned off or reduced. Any change in the applied current will result in a battery voltage change that can be measured as a difference in at least two different time intervals after the change has occurred and used for similar calculations which have previously been described as $\Delta V_1$ and $\Delta V_2$.

Figure 14:
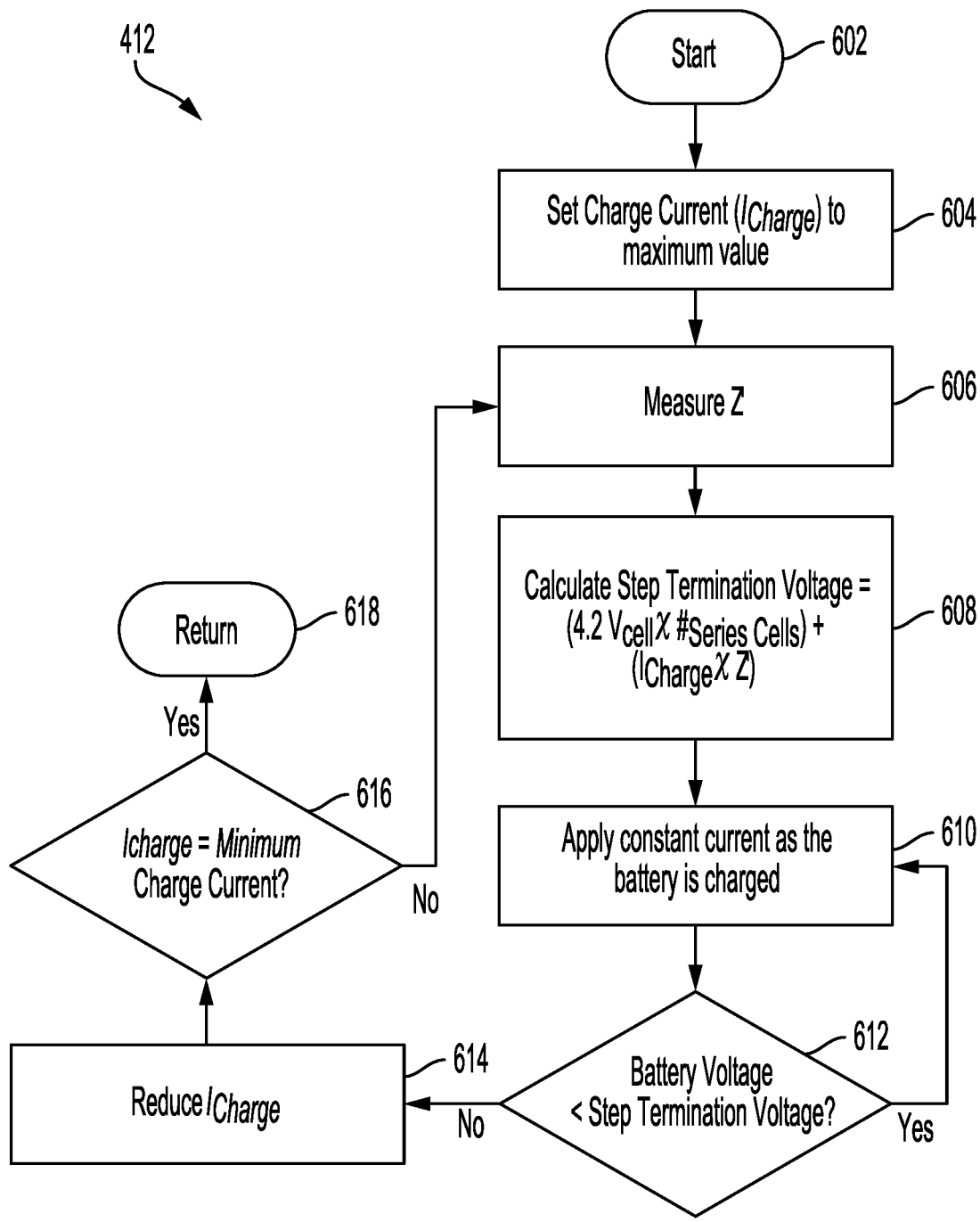
FIG. 14 illustrates an example flow chart for determining a charge scheme implemented by an example battery charger.

Another aspect of this disclosure is described herein with reference to FIG. 14 and with continued reference to FIG. 6. Specifically, an alternative fast charging scheme for step 424 of FIG. 6 is described here, according to an example embodiment.

As described above with reference to FIG. 6, a maximum charge rate is applied where the charger controller 204 determines that the measured electrical impedance is indicative of a battery pack with no electrical breakages or other abnormalities within its strings of cells (steps 410-412). The maximum charge rate is applied using a constant current scheme until reaching predetermined threshold voltages. In this scheme, constant current is initially applied as the battery pack voltage increases with charge until a maximum or threshold voltage level is reached, followed by lower currents being applied in a stepped fashion as the battery voltage is maintained at the maximum or threshold voltage level. For example, for a battery pack having five cells in series (5S×P) and commercially rated as a 20V Max battery pack with a nominal voltage of 18V, a 4A constant current is applied until the battery voltages reaches 21V or 4.2V average per cell under charge. The voltage is then maintained at the 21V target level while the current is stepped down from 4A to 2A and then to 1A in this example.

While this scheme provides many advantages in terms of ease of execution, it is limiting in that the voltage measured by the charger is the voltage under charge and not an accurate representation of the open circuit voltage of the maximum voltage that could be achieved within safe limits of the battery pack. The electrical impedance of the battery pack multiplied by the current results in a voltage drop or loss that is a part of the measured voltage in the charger. In the chargers having a relatively low charge current (e.g., 4 A or below), this voltage drop is not significant and therefore need not be compensated for. However, in higher current chargers (e.g., 12 A or 18 A), this voltage drop becomes increasingly significant. It has also been observed that charging the five-cell battery pack (5S×P) noted above with such high current chargers using the constant current/constant voltage scheme underutilizes the charge capacity of the battery pack and charges the battery pack to a lower open circuit voltage (e.g., 20.7V) and also terminates the constant current charge step at the set threshold voltage at a time earlier than if the battery voltage was compensated accurately for the voltage drop or loss from the product of the electrical impedance and the charge current applied.

In an example embodiment, the charger controller 204 is configured to compensate for the voltage drop associated with the pack resistive impedance in an efficient and precise manner by periodically measuring the resistive impedance of the battery pack, as described above. This periodic measurement of Z' could be made with every adjustment of charge current, for example. In other example embodiments, it may be made even more frequently, including during the charge step. In an example embodiment, in order to take advantage of the full charge capacity of the battery pack, the charger controller 204 is configured to set the step termination voltage to a level above the conventional maximum voltage level using the following equation:

$$V_{Compensated} = (4.2 V_{cell} \times \#_{Series\ Cells}) + (I_{Charge} \times Z')$$

In this equation, $(4.2\ V_{cell} \times \#_{Series\ Cells})$ denotes the conventional maximum voltage level, $I_{Charge}$ denotes the charge current, and Z' denotes the measured electrical impedance, which as previously described, is most closely associated with the battery pack electrical resistance and isolates the effects of the chemical impedance on the actual measured voltage in the charger. For example a battery with 5S×P configuration has at least 5 serially connected cells or cell subunits with x parallel connections and a charged battery voltage Watt equal to 4.2V*5=21$V_{Batt}$; in a charger having a maximum current capacity of 12 A charging a 5S×P battery pack having a 0.05Ω impedance, $V_{Compensated}=21V_{Batt}+12 A*0.05Ω=21.6V_{Batt}$. In an example embodiment, using this equation, the charger controller 204 applies a maximum constant current until $V_{Compensated}$ is reached, then steps down the charge current, recalculates $V_{Compensated}$, and repeats this process. For example, the charger controller 204 applies a maximum constant current of 12 A at a target voltage of 21.6V, 8 A at a target voltage of 21.4 A, 4 A at a target voltage of 21.2V, and 2 A at a target voltage of 21.1V. In this example embodiment, the maximum or threshold voltage for the step can be variable for each step and is dependent upon the voltage loss which is unique to that battery pack instead of being reliant on the limited information provided by the ID and stored in the charger memory. This allows the charging behavior to be dynamic with different packs as they age instead of the previously defined static scheme which has inherent limitations. The longer time a higher current step is extended before termination, the more charge that can be passed earlier in the cycle and the closer the battery pack can be charged to its full OCV capacity of 21V after the charge current is removed. This allows the charger controller 204 to apply constant current with variable voltage termination depending on the current and calculated as a product of the electrical impedance of the battery pack to maximize the battery capacity. With both higher current chargers and higher capacity battery packs, the variable voltage termination scheme with each current step can save substantial amounts of time in charging (e.g. 15 min on a 12 AH battery pack with a 12A charger), especially to ~80% state of charge (SoC) where a first indicator light might alert the user to completion of a charging stage.

In a further example embodiment, the cell voltage may be measured individually for each cell or subunit of cells. Rather than measuring the total battery voltage, in some instances, the voltage may be measured through the charger controller 204 connection to battery terminals which are connected to individual cells, subunits of cells, or other subdivisions of the battery which result in voltages measured which are less than the total battery voltage and can include intermediate voltage potentials. These voltages may also be measured through battery terminals which are not connected to charge current carrying paths of the charger. In a 20V Max battery for example, voltage information may be obtained for all 5S cell units or 5S×P subunits connected in parallel. In this specific example, cells at the end of series subunits may have greater voltage drop measured at B+/B− terminals than cell subunits which are measured through non-current carrying terminals of the battery. Therefore, when the charger controller 204 compensates the termination voltages for series cell subunit values, it may be of value to compensate uniquely for specific cell subunit voltages instead of the total battery voltage. In these alternative executions, instead of the total battery $V_{Compensated}$, values may be directly measured and/or calculated for cell subunits $V_{Cell\_compensated}$. According to the example provided for a 20V Max battery with 5 cell subunits charged to 4.2V, the following equation can be used for calculating a fully charged $V_{Cell\_compensated}$ for cell subunits connected to B+ or B− terminals. In this equation, the term cell(s) can be used interchangeably with cell subunit(s) and constant values are provided only as an example.

$$V_{Cell\_compensated}=4.2V_{cell}+(I_{Charge/cell}\times(Z'/5))$$

FIG. 14 depicts an example flow diagram executed by the charger controller 204 in step 412 (FIG. 6) to maximize the battery pack voltage at full charge, according to an example embodiment. In an example embodiment, beginning in step 602, the charger controller 204 sets the charge current $I_{Charge}$ to a maximum value (e.g., 12 A) in step 604. The charger controller 204 makes a measurement of the battery pack electrical impedance, which as previously described, is independent of the chemical impedance of the battery pack, in step 606. The termination voltage for a charge step $V_{Compensated}$ and/or $V_{Cell\_compensated}$ is calculated using the equation above based on the set $Ich_{arge}$ for prescribed charge step and the measured electrical impedance in step 608. Constant charge current $I_{charge}$ is then applied to the battery pack in step 610 until the battery pack voltage reaches the compensated termination voltage in step 612. Once the termination voltage for battery $V_{compensated}$ and/or $V_{Cell\_compensated}$ is reached for that step, the charge current $I_{Charge}$ is reduced to a lower value and another compensated termination voltage is defined for the reduced $I_{Charge}$ current in step 614 and steps 606-614 are repeated until $I_{Charge}$ reaches a minimum charge current (e.g., 1 A) in step 616. Between and/or during charge steps, another periodic measurement of Z' may be taken. After periodic measurement of Z', a new calculation of battery $V_{Compensated}$ or $V_{Cell\_compensated}$ can be made. The process terminates in step 618.

In an example embodiment, the compensation technique described here should advantageously compensate for resistive impedance $R_0$ or $R_{Electrical}$ alone, which is also equivalent to Z' and can be used somewhat interchangeably but is more commonly used in DC measurements and equivalent circuit models for batteries such as those shown in FIGS. 12 and 7, respectively. In an example embodiment, it is therefore desirable to set the AC excitation frequency to a value where phase shift is near 0 degrees in order to minimize any contribution from both chemical and inductive impedances.

Figure 15A:
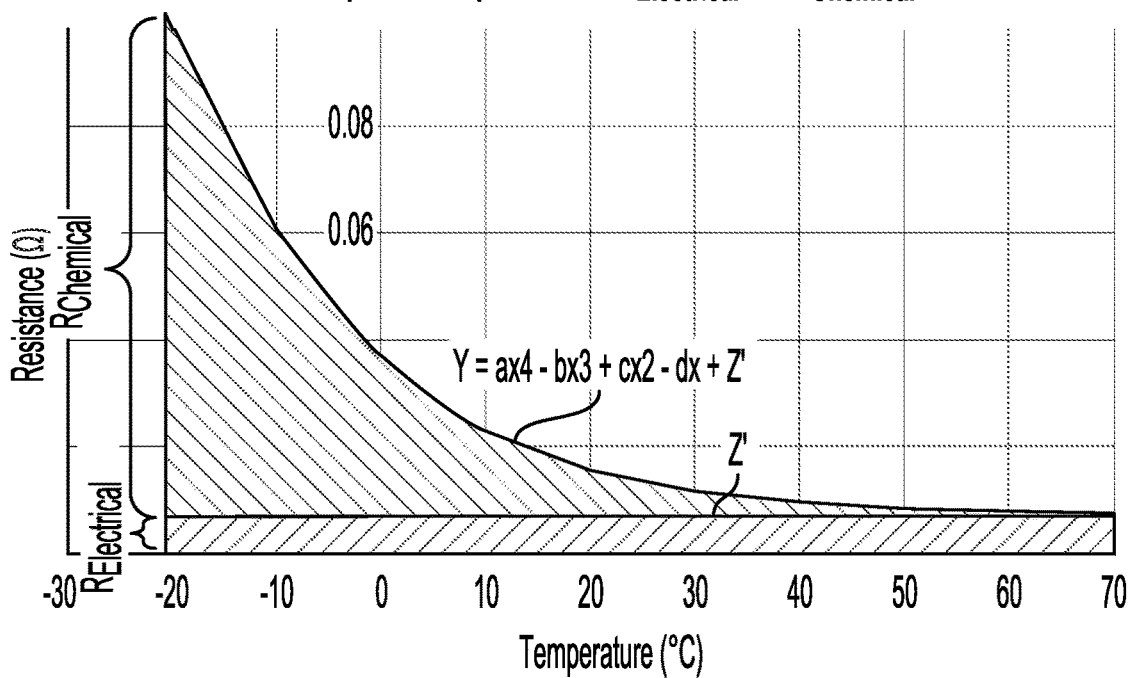
FIG. 15A illustrates a graph of electrical resistance and chemical impedance of an example battery pack and FIG. 15B illustrates a graph of age dependency of electrical resistance and chemical resistance of an example battery pack.
Figure 15B:
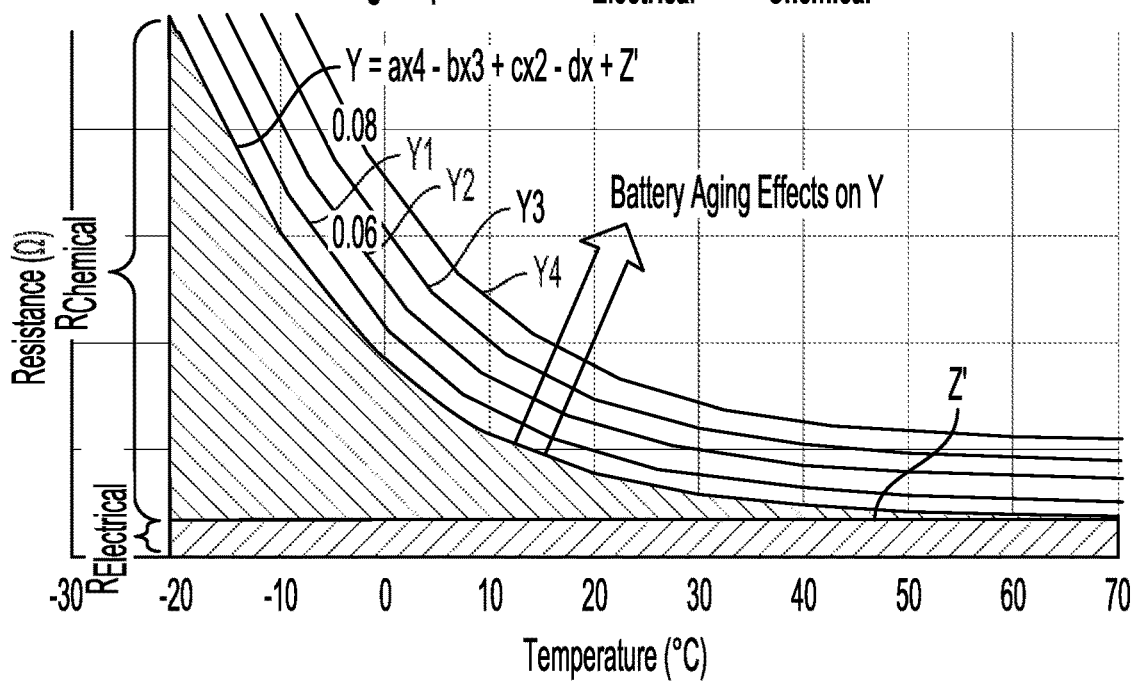
Figure 16:
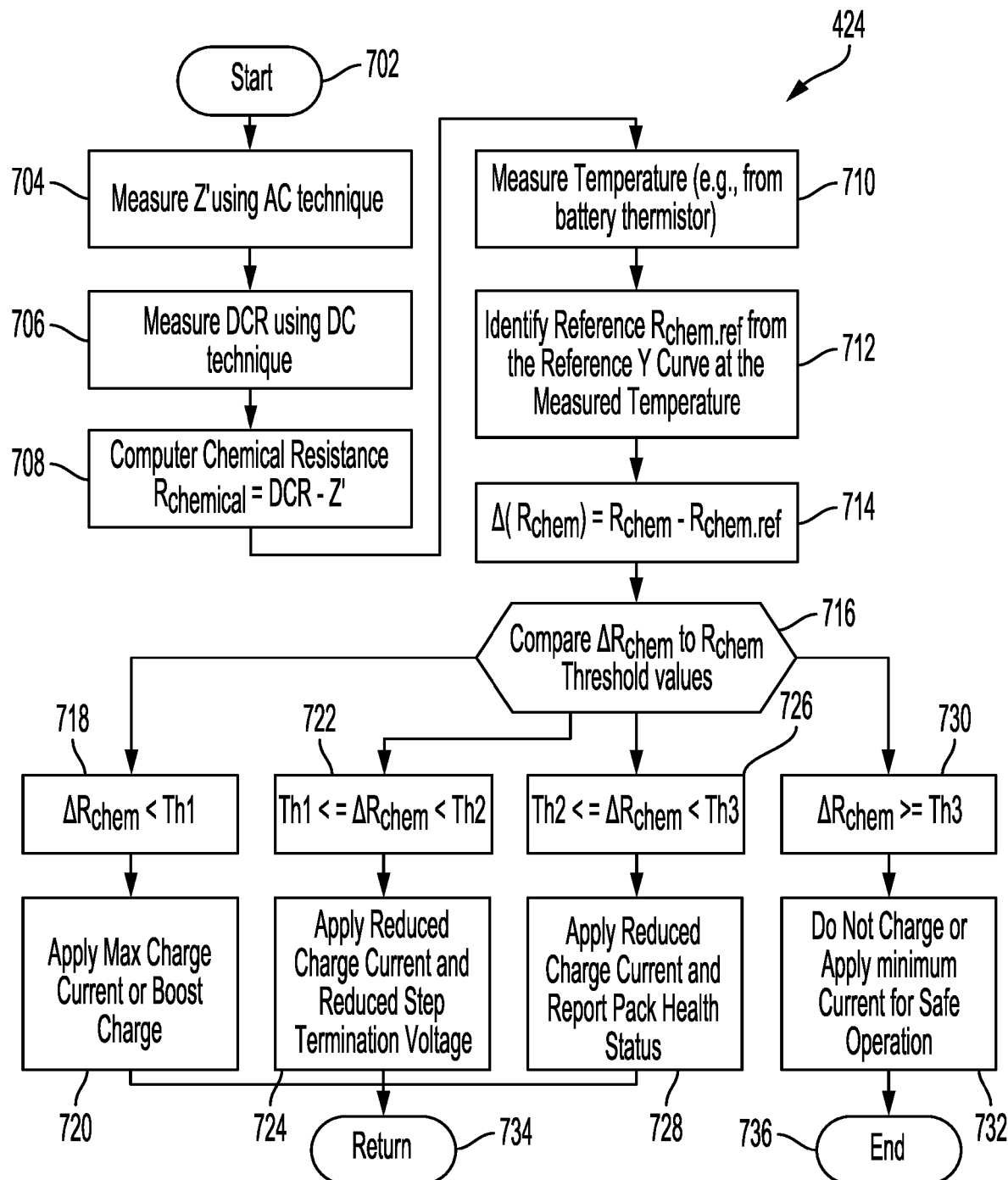
FIG. 16 illustrates an example flowchart for determining a charge scheme implemented by an example battery charger.

Another aspect of this disclosure is described herein with reference to FIGS. 15A-16 and with continued reference to FIGS. 6 and 10. Specifically, the health assessment step 424 of FIG. 6 is described here in detail.

FIG. 15A depicts a graph of time dependency of electrical resistance ($R_{Electrical}$) and chemical impedance (herein simply denoted by resistance) ($R_{Chemical}$) of a healthy, new battery pack, according to an example embodiment. In this instance, the term R is used, but could interchangeably be defined as Z and follows with previous definitions of electrical and chemical impedance. Specifically, $R_{Electrical}$, $R_0$, and Z' are substantially equivalent. As seen in this figure, the electrical resistance $R_{Electrical}$ of the battery pack, and thus the associated electrical impedance Z', does not vary by temperature. Although, there might be some minor temperature dependence of $R_{Electrical}$ it can be neglected for this example and for practical application. However, the chemical resistance $R_{Chemical}$ of the battery pack, and the associated chemical impedance denoted as Y, is very temperature-dependent and generally decreases as temperature increases within normal limits of operation. Chemical impedance Y in this figure is represented by a fourth-order polynomial equation, where x represents the temperature of the battery pack in degrees Celsius. In an example embodiment, the temperature of the battery pack is measured from a thermistor disposed within the battery pack, as previously described.

FIG. 15B depicts a graph of age dependency of electrical resistance ($R_{Electrical}$) and chemical resistance ($R_{Chemical}$), according to an example embodiment. As shown here, absent of abnormal or serious wear and damage to electrical connections within a battery pack, electrical resistance $R_{Electrical}$ of the battery pack, and thus the associated electrical impedance Z', does not vary significantly by age or has relatively small increases in its measured value with age. Although, there are some effects by typical aging, it is represented by invariability in this simplified example. By contrast, due to decay of the chemical composition of active materials in the battery pack cells over its (cycle) life, the chemical resistance $R_{Chemical}$ of the battery pack increases significantly by age and is typically subject to greater degree of growth when compared to $R_{Electrical}$ measurements. This increase in $R_{Chemical}$ is shown by the upward shift in the Y curve, which Y1-Y4 represent discrete increases to the age of the battery pack indicating a reduction in its state of health (SoH) and calculations for $R_{Chemcial}$ are therefore most closely associated with SoH.

The effect of aging on the impedance of the battery pack can also been seen in FIG. 10 previously described. As shown in FIG. 10, as a battery packs ages, the chemical impedance of the battery pack (i.e., low frequency impedance <1 kHz) is adversely affected. This adverse effect can be seen at lower excitation frequencies (e.g., below 100 Hz), where the impedance of a new battery pack is markedly smaller than the impedance of an aged battery pack.

Charging an old battery pack at the same charge rate as a new battery pack can adversely impact its cell chemistry and lower its lifespan. Conversely, a new battery pack is capable of being charged at a faster rate. In an example embodiment, detection of the SoH of the battery pack can allow the charger to better optimize the charge rate that it applies to the battery pack. In an example embodiment, the charger may be configured to lower the charge rate when it detects an older battery pack and/or conversely provide a "boost charging" option when it detects a fresh battery pack that could be associated with a faster than typical rate.

In an example embodiment, to detect the age of the battery pack, the charger is configured to measure the chemical impedance and temperature of the battery pack and, based on the amount by which the measured chemical impedance deviates from a reference value (i.e., chemical impedance of a new battery pack of the same type as might be stored in memory for a specific battery ID) at the measured temperature, and then adjust the charge current applied to the battery pack. The more the measured chemical impedance deviates (increases) from the reference value, the greater the age (and the lower the SoH) of the battery pack. In an example embodiment, the charger may apply maximum or boost charge to a new and healthy battery pack and/or apply a reduced charge rate to a medium aged battery pack. Further, upon detection of high chemical impedances beyond an upper threshold, the charger may alert the user of the health status of the battery pack and/or refrain from charging the battery pack altogether.

In an example embodiment, the charger may determine the chemical impedance of the battery pack using a combination of AC and DC impedance measurement techniques previously described. Specifically, as previously described, in an example embodiment, the AC frequency-injection technique can be used reliably to measure an electrical impedance of the battery pack at a given optimal frequency (e.g., 1 kHz), while the DC technique (e.g., determined from the measured battery voltage under charge at 1 second after the charge current is applied, $\Delta t_p=1$ second) can be used reliably to measure a total impedance of the battery pack including its electrical and chemical components. It is convenient to measure the DC resistance (DCR) while the constant charge current is being applied according to the following equation; $(V_{Battery}-OCV)/I_{Charge}=DCR$. In an example embodiment, the charger may easily use the DCR technique to measure the total impedance of the battery pack, use the AC frequency-injection technique to measure the electrical impedance Z' or $R_{electrical}$ of the battery pack, and subtract the latter from the former to calculate the chemical impedance only. The chemical impedance is then used to make determinations about the battery SoH.

FIG. 16 depicts an example flow diagram executed by the charger controller 204 in step 412 (FIG. 6) to adjust the charge rate applied to the battery pack based on the health of the battery pack, according to an example embodiment. In an example embodiment, beginning in step 702, the charger controller 204 measures the electrical impedance Z' of the battery pack using the AC frequency-injection technique in step 704. In an example embodiment, this measurement is done at a frequency that is optimized to reduce the phase-shift between voltage and current waveform as much as possible in order to minimize capacitive and inductive impedance components. In step 706, the controller measures the total impedance of the battery pack DCR using the DC technique. Chemical resistance $R_{Chemical}$ is calculated as a function of DCR-Z' in step 708. It is noted that since total impedance is measured using the DC technique, in an example embodiment, chemical resistance and chemical impedance are considered to be substantially equivalent as defined by this DC technique.

In an example embodiment, in order to account for temperature-variance of the measured chemical resistance, the charger controller 204 measures the temperature of the battery pack (e.g., using the battery pack thermistor) in step 710. In step 712, the charger controller 204 identifies a reference value $R_{chem.ref}$ from the reference Y curve of FIG. 15B at the measured temperature. For example, using the example graph of FIG. 15B, the reference value $R_{chem.ref}$ is set to approximately 0.016 Ohms at 20° C. In step 714, the charger controller 204 calculates a difference between the measured chemical resistance and the reference value, $\Delta R_{chem}=R_{chem}-R_{chem.ref}$. In steps 716-732, $\Delta R_{chem}$ is compared to different reference threshold values to adjust the rate of charge of the battery pack.

In an example embodiment, if $\Delta R_{chem}$ is smaller than a first reference Th1 in step 718, the charger controller 204 determines that the battery pack is in great health and applies a maximum charge current to the battery pack in step 720. In an example embodiment, the charger may provide a boost-mode or higher than typical maximum charge current option—for example, in the form of a switch that may be selectively activated by the user to enter a boost mode of operation—where the charger applies the maximum charge current to the battery pack in boost mode.

In an example embodiment, if $\Delta R_{chem}$ is greater than or equal to the first reference Th1 but less than a second reference threshold Th2 in step 722, the charger controller 204 determines that the battery pack is healthy but relatively aged and applies reduced charge current to the battery pack in step 724. In an example embodiment, the charger controller 204 may additionally alter the step termination voltage described above with reference to FIG. 14.

In an example embodiment, if $\Delta R_{chem}$ is greater than or equal to the second reference Th2 but less than a third reference threshold Th3 in step 726, the charger controller 204 determines that the battery pack is capable of operating but in poor health. In this case, the charger controller 204 applies a yet lower charge current to the battery pack in step 728. In an example embodiment, the charger may additionally provide a report relating to the health of the battery pack to the user. This may be done via, for example, activating a dedicated health status LED on the battery pack, or by controlling the illumination of fuel gauge LEDs of the battery pack in a distinct pattern, or by communicating to the user through a wireless means to a connected device.

In an example embodiment, if $\Delta R_{chem}$ is greater than or equal to the third reference Th3 in step 730, the charger controller 204 determines that the health of the battery pack is too poor for safe operation and refrains from charging the battery pack in step 732. In an example embodiment, process 424 ends in step 734.

Table 2 below includes an example reference threshold impedance values Th1-Th3, provided herein by way of example for a 5S3P battery pack about 20° C. or at room temperature.

TABLE 2

| Reference Threshold | $\Delta R_{chem}$ (Ohms) |
|---|---|
| Th1 | 0.01 |
| Th2 | 0.02 |
| Th3 | 0.035 |

The following description illustrates the claimed invention by way of example and not by way of limitation. The description clearly enables one skilled in the art to make and use the disclosure, describes several example embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other example embodiments and of being practiced or being carried out in various ways. Also, it is to be understood that the phraseology and terminology used herein is for the purpose of description and should not be regarded as limiting.

Some of the techniques described herein may be implemented by one or more computer programs executed by one or more processors residing, for example on a power tool. The computer programs include processor-executable instructions that are stored on a non-transitory tangible computer readable medium. The computer programs may also include stored data. Non-limiting examples of the non-transitory tangible computer readable medium are non-volatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The foregoing description of the example embodiments has been provided for purposes of illustration and description. It is not intended to be exhaustive or to limit the disclosure. Individual elements or features of a particular example embodiment are generally not limited to that particular example embodiment, but, where applicable, are interchangeable and can be used in a selected example embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of example embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Numerous modifications may be made to the example implementations described above. These and other implementations are within the scope of this application.

The invention claimed is:

1. A battery charger, comprising:
   an AC impedance circuit to apply a sinusoidal AC excitation signal to a connected battery pack and to measure a battery pack response to the sinusoidal AC excitation signal;
   a charger controller including first circuitry to (1) calculate an impedance value of the connected battery pack based on the sinusoidal AC excitation signal and the battery pack response and (2) select a charging scheme based on the impedance value of the connected battery pack;
   a power supply including second circuitry to provide the charging scheme selected by the charger controller, wherein:

the sinusoidal AC excitation signal is applied prior to and separate from the charging scheme being provided, and the charging scheme is provided after the sinusoidal AC excitation signal is applied; and when the charger controller selects a maximum charging rate charging scheme, the charger controller applies a constant current with a variable termination voltage based on a magnitude of the impedance value of the connected battery pack when the sinusoidal AC excitation signal is set to a value that produces a positive phase shift.

2. The battery charger, as recited in claim 1, wherein the sinusoidal AC excitation signal is a voltage excitation signal and the battery pack response is a current waveform.

3. The battery charger, as recited in claim 2, wherein the impedance value of the connected battery pack is measured using the equation R=V/I, wherein V is a peak amplitude of the voltage excitation signal and I is a peak amplitude of the current waveform and accounts for purely resistive contributions to the impedance value at a chosen frequency.

4. The battery charger, as recited in claim 1, wherein the sinusoidal AC excitation signal is a current signal and the battery pack response is a voltage waveform.

5. The battery charger, as recited in claim 1, wherein the charger controller includes a first reference impedance value, a second reference impedance value and a third reference impedance value and wherein if the impedance value calculated by the charger controller is greater than or equal to the first reference impedance value and less than the second reference impedance value the charger controller selects a maximum charging rate charging scheme to charge the connected battery pack and if the impedance value calculated by the charger controller is greater than or equal to the second reference impedance value and less than the third reference impedance value the charger controller selects a charging rate charging scheme that is less than the maximum charging rate charging scheme to charge the connected battery pack and if the impedance value calculated by the charger controller is greater than or equal to the third reference impedance value the charger controller selects a do not charge charging scheme to charge the connected battery pack.

6. The battery charger, as recited in claim 5, wherein the maximum charging rate charging scheme is based on a battery identification signal received by the charger controller from the connected battery pack.

7. The battery charger, as recited in claim 5, wherein the first reference impedance value is 0.025 Ohms, the second reference impedance value is 0.040 Ohms and the third reference impedance value is 0.055 Ohms.

8. The battery charger, as recited in claim 1, wherein the sinusoidal AC excitation signal is at approximately 1 kHz.

9. The battery charger, as recited in claim 1, wherein a lower impedance value calculated by the charger controller indicates a higher charging rate charging scheme.

10. The battery charger, as recited in claim 1, wherein the sinusoidal AC excitation signal is applied to a positive terminal and a negative terminal of the connected battery pack.

11. The battery charger, as recited in claim 1, wherein the AC impedance circuit and the second circuitry are arranged in parallel to one another.

12. The battery charger, as recited in claim 1, wherein the charger controller applies the constant current until a voltage of the connected battery pack reaches the variable termination voltage and then applies a reduced charge current.

13. The battery charger, as recited in claim 12, wherein the charger controller calculates a new impedance value of the connected battery pack and a new variable termination voltage based on the new impedance value of the connected battery pack.

14. A method of charging a battery pack, comprising:
providing an AC impedance circuit, the AC impedance circuit applying a sinusoidal AC excitation signal to a connected battery pack and measuring a battery pack response to the sinusoidal AC excitation signal;

providing a charger controller, the charger controller (1) calculating an impedance value of the connected battery pack based on the sinusoidal AC excitation signal and the battery pack response and (2) selecting a charging scheme based on the impedance value of the connected battery pack;

providing a power supply including charging circuitry, the power supply providing the charging scheme selected by the charger controller, wherein:
the sinusoidal AC excitation signal is applied prior to and separate from the charging scheme being provided, and the charging scheme is provided after the sinusoidal AC excitation signal is applied and the charging scheme has been selected; and when the charger controller selects a maximum charging rate charging scheme, the charger controller applying a constant current with a variable termination voltage based on a magnitude of the impedance value of the connected battery pack when the sinusoidal AC excitation signal is set to a value that produces a positive phase shift.

15. The method of charging the battery pack, as recited in claim 14, wherein the sinusoidal AC excitation signal is a voltage excitation signal and the battery pack response is a current waveform.

16. The method of charging the battery pack, as recited in claim 15, wherein the impedance value of the connected battery pack calculated by the charger controller is measured using the equation R=V/I, wherein V is a peak amplitude of the voltage excitation signal and I is a peak amplitude of the current waveform and accounts for purely resistive contributions to the impedance value at a chosen frequency.

17. The method of charging the battery pack, as recited in claim 14, wherein the sinusoidal AC excitation signal is a current signal and the battery pack response is a voltage waveform.

18. The method of charging the battery pack, as recited in claim 14, wherein the charger controller includes a first reference impedance value, a second reference impedance value and a third reference impedance value and wherein if the impedance value calculated by the charger controller is greater than or equal to the first reference impedance value and less than the second reference impedance value the charger controller selects a maximum charging rate charging scheme to charge the connected battery pack and if the impedance value calculated by the charger controller is greater than or equal to the second reference impedance value and less than the third reference impedance value the charger controller selects a charging rate charging scheme that is less than the maximum charging rate charging scheme to charge the connected battery pack and if the impedance value calculated by the charger controller is greater than or equal to the third reference impedance value the charger controller selects a do not charge charging scheme to charge the connected battery pack.

19. The method of charging the battery pack, as recited in claim 18, wherein the maximum charging rate charging scheme is based on a battery identification signal received by the charger controller from the connected battery pack.

20. The method of charging the battery pack, as recited in claim 18, wherein the first reference impedance value is 0.025 Ohms, the second reference impedance value is 0.040 Ohms and the third reference impedance value is 0.055 Ohms.

21. The method of charging the battery pack, as recited in claim 14, wherein the sinusoidal AC excitation signal is at approximately 1 kHz.

22. The method of charging the battery pack, as recited in claim 14, wherein a lower impedance value calculated by the charger controller indicates a higher charging rate charging scheme.

23. The method of charging the battery pack, as recited in claim 14, wherein the sinusoidal AC excitation signal is applied to a positive terminal and a negative terminal of the connected battery pack.

24. The method of charging the battery pack, as recited in claim 14, wherein the AC impedance circuit and the charging circuitry are arranged in parallel to one another.

25. The method of charging the battery pack, as recited in claim 14, wherein the charger controller applies the constant current until a voltage of the connected battery pack reaches the variable termination voltage and then applies a reduced charge current.

26. The method of charging the battery pack, as recited in claim 25, wherein the charger controller calculates a new impedance value of the connected battery pack and a new variable termination voltage based on the new impedance value of the connected battery pack.

27. A battery charger, comprising:
an AC impedance circuit to apply a sinusoidal AC excitation signal to a connected battery pack and to measure a battery pack response to the sinusoidal AC excitation signal;
a charger controller including first circuitry to:
calculate a first impedance value of a first connected battery pack,
set a first charging rate to a maximum value for the first connected battery pack,
calculate a first variable termination voltage based on a magnitude of the impedance value of the first connected battery pack when the sinusoidal AC excitation signal is set to a value that produces a positive phase shift, or
calculate a second impedance value of a second connected battery pack,
set a second charging rate to a maximum value for the second connected battery pack,
calculate a second variable termination voltage based on a magnitude of the impedance value of the second connected battery pack when the sinusoidal AC excitation signal is set to a value that produces a positive phase shift; and
when the charger controller sets the first charging rate to the maximum value for the first connected battery pack or the second charging rate to the maximum value for the second connected battery pack, apply a constant current based on the first variable termination voltage as calculated as the first connected battery pack is charged or based on the second variable termination voltage as calculated as the second connected battery pack is charged; and
a power supply including second circuitry to provide the first charging rate or the second charging rate set by the charger controller,
wherein the first charging rate and the first variable termination voltage for the first connected battery pack is different than the second charging rate and the second variable termination voltage for the second connected battery pack.

28. The battery charger, as recited in claim 27, wherein the charger controller applies the constant current until a voltage of the first connected battery pack reaches the first variable termination voltage or the second connected battery pack reaches the second variable termination voltage and then applies a reduced charge current.

29. The battery charger, as recited in claim 28, wherein the charger controller calculates a new impedance value of the connected battery pack and a new variable termination voltage based on the new impedance value of the connected battery pack.

* * * * *